United States Patent
Doi et al.

(10) Patent No.: US 9,494,625 B2
(45) Date of Patent: Nov. 15, 2016

(54) POWER MANAGEMENT DEVICE, METHOD OF CONTROLLING POWER MANAGEMENT DEVICE, AND PROGRAM FOR CONTROLLING POWER MANAGEMENT DEVICE

(71) Applicant: Sharp Kabushiki Kaisha, Osaka-shi, Osaka (JP)

(72) Inventors: Misuzu Doi, Osaka (JP); Yohhei Iwami, Osaka (JP); Yumiko Kawazoe, Osaka (JP); Satoshi Kishi, Osaka (JP); You Ka, Osaka (JP); Hirosuke Miki, Osaka (JP); Hiroyoshi Toda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 119 days.

(21) Appl. No.: 14/357,509

(22) PCT Filed: Nov. 7, 2012

(86) PCT No.: PCT/JP2012/078815
§ 371 (c)(1),
(2) Date: May 9, 2014

(87) PCT Pub. No.: WO2013/069671
PCT Pub. Date: May 16, 2013

(65) Prior Publication Data
US 2014/0340075 A1 Nov. 20, 2014

(30) Foreign Application Priority Data

Nov. 11, 2011 (JP) ................................. 2011-247456
Nov. 11, 2011 (JP) ................................. 2011-247844

(51) Int. Cl.
*G01R 1/00* (2006.01)
*G01R 13/04* (2006.01)
(Continued)

(52) U.S. Cl.
CPC ............... *G01R 21/00* (2013.01); *G01D 4/002* (2013.01); *G01R 22/10* (2013.01); *Y02B 70/3266* (2013.01);
(Continued)

(58) Field of Classification Search
None
See application file for complete search history.

(56) References Cited

U.S. PATENT DOCUMENTS

| | | |
|---|---|---|
| 2009/0195349 A1 | 8/2009 | Frader-Thompson et al. |
| 2010/0174419 A1 | 7/2010 | Brumfield et al. |

(Continued)

FOREIGN PATENT DOCUMENTS

| | | |
|---|---|---|
| EP | 1 441 430 A1 | 7/2004 |
| EP | 2 221 586 A1 | 8/2010 |

(Continued)

*Primary Examiner* — Minh N Tang
(74) *Attorney, Agent, or Firm* — Birch, Stewart, Kolasch & Birch, LLP

(57) ABSTRACT

A management system for managing measurement information on power consumption in at least one electrical appliance which is associated with at least one meter includes a first storage module configured to store measurement information transmitted from each of the at least one meter associated with the at least one electrical appliance, on power consumption in the at least one electrical appliance, in correspondence with the at least one meter. The management system also includes a second storage module configured to store history information on association between each of the at least one meter and the at least one electrical appliance. An information output module may be configured to output, in response to selection of an electrical appliance, as electric power information on the selected electrical appliance, information on power consumption in the selected electrical appliance brought in correspondence with a time period regardless of a meter associated with the selected electrical appliance, which is based on the measurement information in the first storage module and the history information in the second storage module.

6 Claims, 35 Drawing Sheets

(51) Int. Cl.
  *G01R 29/00* (2006.01)
  *G01R 21/00* (2006.01)
  *G01D 4/00* (2006.01)
  *G01R 22/10* (2006.01)

(52) U.S. Cl.
  CPC ............ *Y02B 90/241* (2013.01); *Y02B 90/245* (2013.01); *Y04S 20/242* (2013.01); *Y04S 20/32* (2013.01); *Y04S 20/40* (2013.01)

(56) References Cited

U.S. PATENT DOCUMENTS

| | | | |
|---|---|---|---|
| 2011/0185196 A1* | 7/2011 | Asano | B60L 11/1809 713/300 |
| 2011/0225149 A1 | 9/2011 | Takahashi et al. | |
| 2012/0053740 A1* | 3/2012 | Venkatakrishnan | G06Q 50/06 700/291 |

FOREIGN PATENT DOCUMENTS

| | | |
|---|---|---|
| JP | 8-161314 A | 6/1996 |
| JP | 9-84146 A | 3/1997 |
| JP | 2007-11919 A | 1/2007 |
| JP | 2009-74966 A | 4/2009 |
| JP | 2009-240065 A | 10/2009 |
| JP | 2010-114967 A | 5/2010 |
| JP | 2010-146268 A | 7/2010 |
| JP | 2011-120428 A | 6/2011 |
| JP | 2011-187011 A | 9/2011 |
| WO | WO 2011/029137 A2 | 3/2011 |
| WO | WO 2011/073691 A2 | 6/2011 |

\* cited by examiner

| METER | MEASUREMENT INFORMATION | | | |
|---|---|---|---|---|
| | | | | |
| METER A | MEASUREMENT INFORMATION A(t1) | MEASUREMENT INFORMATION A(t2) | ... | MEASUREMENT INFORMATION A(tN) |
| METER B | MEASUREMENT INFORMATION B(t1) | ... | ... | MEASUREMENT INFORMATION B(tN) |
| ... | ... | ... | ... | ... |
| METER N | MEASUREMENT INFORMATION N(t1) | MEASUREMENT INFORMATION N(t2) | ... | MEASUREMENT INFORMATION N(tN) |

3501 / 3502

(b)

150

| APPLIANCE TO BE MEASURED | TIME AND DATE OF START OF CONNECTION | TIME AND DATE OF END OF CONNECTION | CONNECTION TARGET |
|---|---|---|---|
| APPLIANCE TO BE MEASURED 1 | 2010/8/1 12:00 | 2011/2/1 23:45 | METER A |
| APPLIANCE TO BE MEASURED 1 | 2011/2/1 23:45 | 2011/4/15 10:05 | METER B |
| APPLIANCE TO BE MEASURED 2 | 2011/7/2 17:50 | — | METER A |
| APPLIANCE TO BE MEASURED 2 | 2011/2/1 23:45 | 2011/7/2 17:50 | METER A |
| APPLIANCE TO BE MEASURED 3 | 2011/4/15 10:05 | — | METER C |
| ... | ... | ... | ... |

APPLIANCE SETTING OF POWER MEASUREMENT DEVICE

654

| | IDENTIFICATION NUMBER | FLOOR | ROOM | APPLIANCE | |
|---|---|---|---|---|---|
| 1. | 00:12:4b:00:01:86:be:9d | 1F | KITCHEN | MICROWAVE OVEN | |
| 2. | 00:12:4b:00:01:86:bf:38 | 1F | DINING ROOM | LIGHTING | |
| 3. | 00:12:4b:00:01:86:be:ce | 1F | CHILD'S ROOM | LIGHTING | |
| 4. | 00:12:4b:00:01:86:be:cf | 2F | STUDY | LIGHTING | |
| 5. | 00:12:4b:00:01:86:be:24 | 2F | STUDY | AIR-CONDITIONER | |

INTERCHANGE — 661
SET — 662
DELETE — 663
COMPLETE — 664

FIG.18
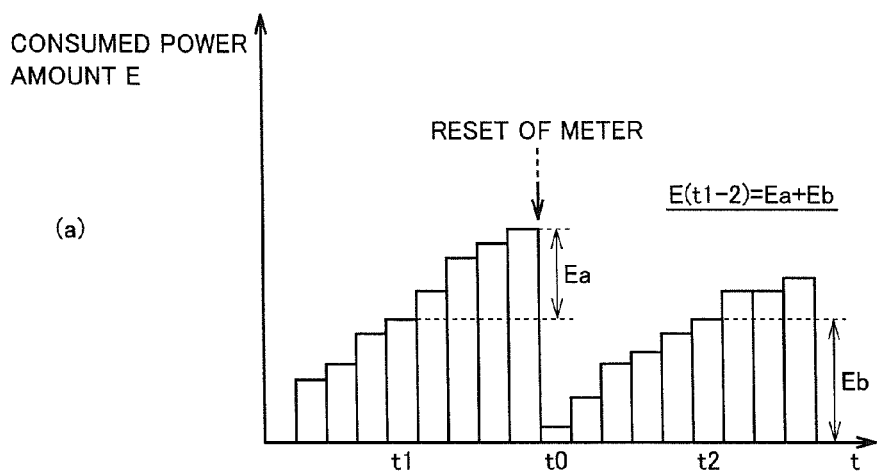
(a)
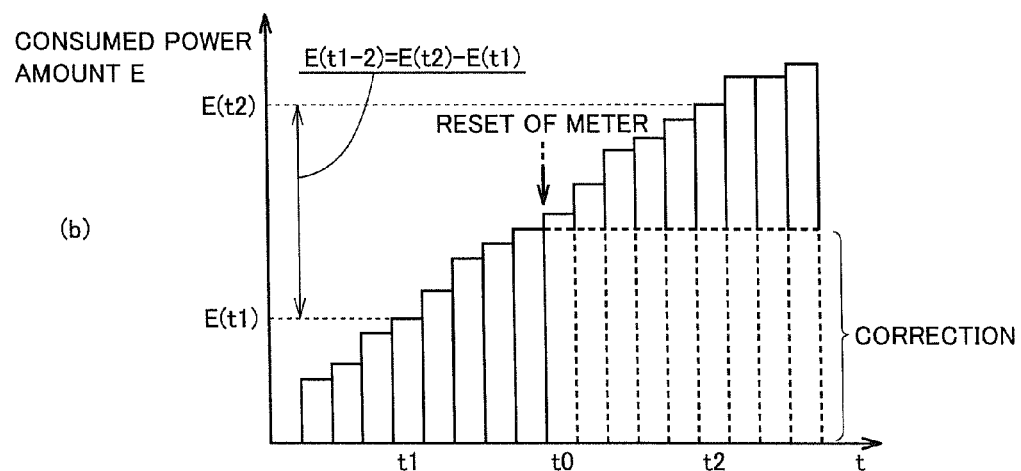
(b)

| APPLIANCE TO BE MEASURED | TIME AND DATE OF START OF CONNECTION | CONNECTION TARGET |
|---|---|---|
| APPLIANCE TO BE MEASURED 1 | 2011/7/2 17:50 | METER A |
| APPLIANCE TO BE MEASURED 2 | — | — |
| APPLIANCE TO BE MEASURED 3 | 2011/4/15 10:05 | METER C |
| ⋮ | ⋮ | ⋮ |

| | | | MEASUREMENT INFORMATION | | | | 350B |
|---|---|---|---|---|---|---|---|
| METER | TIME AND DATE OF START OF CONNECTION | CONNECTION TARGET | | | | | |
| METER A | 2011/7/2 17:50 | APPLIANCE TO BE MEASURED 1 | MEASUREMENT INFORMATION A(0) | MEASUREMENT INFORMATION A(+1) | ... | MEASUREMENT INFORMATION A(+N) | ... |
| METER B | 2011/2/1 23:45 | APPLIANCE TO BE MEASURED 1 | MEASUREMENT INFORMATION B(0) | MEASUREMENT INFORMATION B(+1) | ... | ... | ... |
| METER C | 2011/4/15 10:05 | APPLIANCE TO BE MEASURED 3 | MEASUREMENT INFORMATION C(0) | MEASUREMENT INFORMATION C(+1) | ... | MEASUREMENT INFORMATION C(+N) | ... |
| ... | ... | ... | ... | ... | ... | ... | ... |

| APPLIANCE TO BE MEASURED | TIME AND DATE OF START OF MEASUREMENT | CONNECTION TARGET | MEASUREMENT INFORMATION | | | | | |
|---|---|---|---|---|---|---|---|---|
| APPLIANCE TO BE MEASURED 1 | 2011/7/2 17:50 | METER A | MEASUREMENT INFORMATION B(t1) | MEASUREMENT INFORMATION B(t2) | ... | — | — | MEASUREMENT INFORMATION A(tN+1) |
| APPLIANCE TO BE MEASURED 2 | — | — | MEASUREMENT INFORMATION A(t1) | MEASUREMENT INFORMATION A(t2) | ... | MEASUREMENT INFORMATION A(tN) | — | |
| APPLIANCE TO BE MEASURED 3 | 2011/4/15 10:05 | METER C | — | — | ... | MEASUREMENT INFORMATION B(tN) | MEASUREMENT INFORMATION C(tN+1) | |
| ... | ... | ... | ... | ... | ... | ... | ... | |

3701　3704　3705　3702

FIG.36
(a) 
(b) 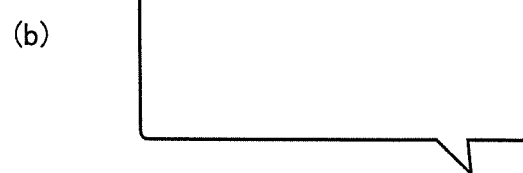
(c) 

POWER MANAGEMENT DEVICE, METHOD OF CONTROLLING POWER MANAGEMENT DEVICE, AND PROGRAM FOR CONTROLLING POWER MANAGEMENT DEVICE

TECHNICAL FIELD

The present invention relates to a power management device managing electric power information on power consumption in at least one electrical appliance, and a method and a program for controlling a power management device.

BACKGROUND ART

In recent years, from a point of view of environmental conservation or energy issues, efforts for enhancing consciousness about energy conservation (hereinafter also referred to as "energy saving") in electrical appliances (mainly household electrical appliances) used at home have been made. Energy saving is an attempt to reduce an amount of energy consumption by efficiently using energy or suppressing excessive energy consumption. A HEMS (Home Energy Management System) has been put into practical use for supporting such efforts. By employing such a HEMS, power management or power control at home can more readily be achieved.

In order to realize energy saving, initially, a state of power consumption in an electrical appliance should be measured. Setting aside an electrical appliance having means for measuring a state of power consumption, an already existing electrical appliance should be provided with a meter in order to measure a state of power consumption therein.

In order to realize energy saving, initially, a state of power consumption in an electrical appliance should be measured. In this connection, a power management system disclosed in Japanese Patent Laying-Open No. 2011-120428 (PTD 1) measures electric power for each branch breaker, groups results of measurement, and displays electric power usage in a list.

CITATION LIST

Patent Document

PTD 1: Japanese Patent Laying-Open No. 2011-120428

SUMMARY OF INVENTION

Technical Problem

In the power management system disclosed in Japanese Patent Laying-Open No. 2011-120428 (PTD 1) described above, however, electric power is measured for each branch breaker, and data is obtained and grouped in accordance with a condition of installed branch breakers. Therefore, it is impossible to obtain data on power consumption for each electrical appliance and to group the data into information on a state of power consumption useful for a user for display.

The present invention was made to solve such a problem, and an object thereof is to provide a power management device capable of presenting information on a state of power consumption in a plurality of electrical appliances which is useful for a user, and a method and a program for controlling a power management device.

Solution to Problem

A power management device according to one aspect of the present invention includes an obtaining portion for obtaining information on power consumption from a plurality of electrical appliances, a display portion, and a controller for causing the display portion to display the information on power consumption in the plurality of electrical appliances obtained through the obtaining portion. In each electrical appliance, a plurality of pieces of attribute information are set in advance in association. The controller carries out grouping of the plurality of electrical appliances in a plurality of layers based on the plurality of pieces of attribute information, and for each group categorized through grouping in the plurality of layers, the controller causes information on power consumption in an electrical appliance belonging to the group to be displayed.

Preferably, the controller can accept an instruction for displaying the information on power consumption in an electrical appliance belonging to each group, and when the instruction is accepted, the controller causes the information on power consumption in an electrical appliance belonging to an upper group among the plurality of electrical appliances to be displayed for each electrical appliance.

In particular, the instruction is a selection instruction for each group, when the controller accepts the selection instruction, the controller can cause the display portion to display the information on power consumption expanded for each group, for each electrical appliance belonging to the group, the information on power consumption for each electrical appliance belonging to the selected group is displayed in a display region of the display portion, and the information on power consumption for each electrical appliance belonging to a group not displayed in the display region is displayed in the display region of the display portion in response to an operation instruction.

In particular, the information on power consumption is at least one of consumed power and an amount of consumed power in connection with the plurality of electrical appliances, and the controller causes at least one of consumed power and the amount of consumed power to be displayed in an order in accordance with a prescribed scheme for each electrical appliance belonging to the selected group.

Preferably, the information on power consumption is at least one of consumed power and an amount of consumed power in connection with the plurality of electrical appliances, priority is set and allocated in advance to at least one piece of attribute information of the plurality of pieces of attribute information, and the controller causes, for each group categorized through grouping in the plurality of layers in accordance with the priority allocated to the attribute information, at least one of total consumed power and a total amount of consumed power in electrical appliances belonging to the group to be displayed.

Preferably, the controller causes, for each group categorized through grouping into the plurality of layers, an object indicating information on power consumption in an electrical appliance belonging to the group provided such that an instruction for selection can be given to be displayed.

In particular, the object is displayed such that objects in accordance with the number of electrical appliances belonging to each group are layered.

A method of controlling a power management device according to one aspect of the present invention includes the steps of obtaining, by the power management device, information on power consumption from a plurality of electrical appliances and displaying, by the power management device, the obtained information on power consumption in connection with the plurality of electrical appliances on a display portion. In each electrical appliance, a plurality of pieces of attribute information are set in advance in association. The displaying step includes the steps of carrying out, by the power management device, grouping of the plurality of electrical appliances in a plurality of layers based on the plurality of pieces of attribute information and displaying, by the power management device, for each group categorized through grouping into the plurality of layers, the information on power consumption in an electrical appliance belonging to the group.

A program for controlling a power management device according to one aspect of the present invention is a program for controlling a power management device having a display portion, and it causes a computer to perform processing including the steps of obtaining, by the computer, information on power consumption from a plurality of electrical appliances and displaying, by the computer, the obtained information on power consumption in connection with the plurality of electrical appliances on the display portion. In each electrical appliance, a plurality of pieces of attribute information are set in advance in association. The displaying step includes the steps of carrying out, by the computer, grouping of the plurality of electrical appliances in a plurality of layers based on the plurality of pieces of attribute information and displaying, by the computer, for each group categorized through grouping into the plurality of layers, the information on power consumption in an electrical appliance belonging to the group.

According to one aspect of the present invention, a management system for managing measurement information on power consumption in at least one electrical appliance is provided. The management system includes first storage means for chronologically storing for each meter, measurement information on power consumption in the electrical appliance transmitted from the meter associated with each electrical appliance, second storage means for storing history information on association between the meter and the electrical appliance, and information output means for outputting, in response to selection of an electrical appliance, electric power information on the selected electrical appliance by extracting measurement information corresponding to the selected electrical appliance from measurement information stored for each meter.

Preferably, the second storage means stores as history information for each electrical appliance, time at which association with the meter was activated and information for identifying the associated meter.

Alternatively, preferably, the second storage means stores as history information for each electrical appliance, information for identifying a most recently associated meter.

Preferably, the management system further includes selection accepting means for providing a user interface screen for accepting designation of an associated electrical appliance for each meter. The second storage means updates contents in the history information based on designation of an electrical appliance accepted through the selection accepting means.

According to another aspect of the present invention, a management device for managing measurement information on power consumption in at least one electrical appliance is provided. The management device includes first storage means for chronologically storing for each meter, measurement information transmitted from a meter associated with each electrical appliance, on power consumption in that electrical appliance, second storage means for storing history information on association between the meter and the electrical appliance, and information output means for outputting, in response to selection of an electrical appliance, electric power information on the selected electrical appliance by extracting measurement information corresponding to the selected electrical appliance from measurement information stored for each meter.

According to yet another aspect of the present invention, a management program for managing measurement information on power consumption in at least one electrical appliance causes a computer to function as first storage means for chronologically storing for each meter, measurement information transmitted from a meter associated with each electrical appliance, on power consumption in that electrical appliance, second storage means for storing history information on association between the meter and the electrical appliance, and information output means for outputting, in response to selection of an electrical appliance, electric power information on the selected electrical appliance by extracting measurement information corresponding to the selected electrical appliance from measurement information stored for each meter.

According to yet another aspect of the present invention, a management system for managing measurement information on power consumption in at least one electrical appliance is provided. The management system includes obtaining means for obtaining measurement information transmitted from a meter associated with each electrical appliance, on power consumption in that electrical appliance, and storage means for chronologically storing measurement information obtained from each meter in association with a corresponding electrical appliance, based on correspondence between a meter and an electrical appliance set in advance.

Preferably, the management system further includes information output means for outputting electric power information on each electrical appliance, based on the measurement information stored in the storage means.

Preferably, the management system further includes selection accepting means for providing a user interface screen for accepting designation of an associated electrical appliance for each meter.

Preferably, the storage means stores the measurement information together with information for identifying a meter which conducts measurement.

According to yet another aspect of the present invention, a management device for managing measurement information on power consumption in at least one electrical appliance is provided. The management device includes obtaining means for obtaining measurement information transmitted from a meter associated with each electrical appliance, on power consumption in that electrical appliance, and storage means for chronologically storing measurement information obtained from each meter in association with a corresponding electrical appliance, based on correspondence between a meter and an electrical appliance set in advance.

According to yet another aspect of the present invention, a management program for managing measurement information on power consumption in at least one electrical appliance is provided. The management program causes a computer to function as obtaining means for obtaining measurement information transmitted from a meter associated with each electrical appliance, on power consumption in that electrical appliance, and storage means for chronologically storing measurement information obtained from each meter in association with a corresponding electrical appliance, based on correspondence between a meter and an electrical appliance set in advance.

Advantageous Effects of Invention

According to the present invention, information on a state of power consumption in a plurality of electrical appliances which is useful for a user is presented.

BRIEF DESCRIPTION OF DRAWINGS

FIG. 9 is a diagram showing one example of a data structure in a table used in the management system according to a first embodiment of the present invention.

FIG. 13 is a diagram showing one example of a user interface screen involved with an operation for changing setting provided in the management system according to the first embodiment of the present invention.

FIG. 17 is a diagram showing one example of a user interface screen involved with an operation for changing setting provided in the management system according to the first embodiment of the present invention.

FIG. 18 is a diagram for illustrating processing for correcting measurement information in the management system according to the embodiment of the present invention.

FIG. 19 is a diagram showing one example of a data structure in a history information table used in the management system according to a first variation of the first embodiment of the present invention.

FIG. 20 is a diagram showing one example of a data structure in a measurement information table used in the management system according to a second variation of the first embodiment of the present invention.

FIG. 26 is a diagram showing one example of a data structure in a measurement information table used in a management system according to a first variation of the second embodiment of the present invention.

FIG. 36 is a diagram illustrating a variation of a form of a power management object according to the third embodiment of the present invention.

DESCRIPTION OF EMBODIMENTS

Figure 1:
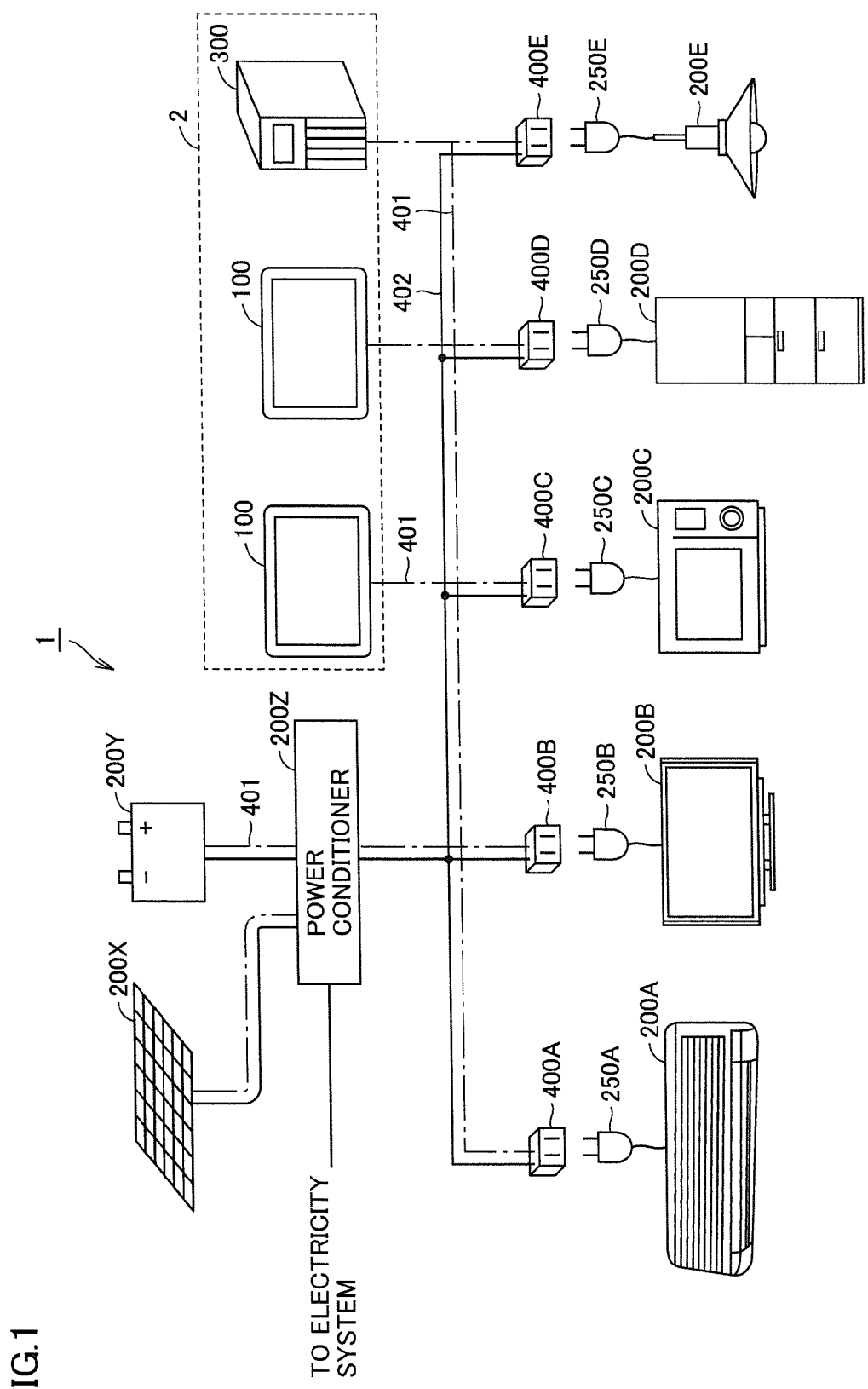
FIG. 1 is a schematic diagram showing an overall configuration of a power system including a management system according to an embodiment of the present invention.

An embodiment of the present invention will be described hereinafter with reference to the drawings. In the description below, the same elements have the same reference characters allotted. Their label and function are also identical. Therefore, detailed description thereof will not be repeated.

[A. Overall Configuration of System]

A management system according to the present embodiment manages measurement information on power consumption in at least one electrical appliance. A photovoltaic power generation apparatus or a fuel cell may be managed, and in this case, the management system according to the present embodiment may manage measurement information on power generation in addition to or instead of measurement information on power consumption.

Measurement information and electric power information output based on the measurement information herein refer to a concept including various types of information involved with power consumption/power generation in a corresponding electrical appliance. More specifically, measurement information and electric power information include instantaneous electric power supplied and received to and from a corresponding appliance to be measured (electrical appliance) (hereinafter simply also referred to as "electric power") (unit: W or kW) and an amount of electric power (unit: Wh or kWh) which is an accumulated amount of electric power over a prescribed period of time. In addition, measurement information and electric power information herein may include a physical quantity relating directly or indirectly to power consumption/power generation in a corresponding appliance to be measured (electrical appliance) such as a voltage, a current, a temperature, a humidity, illumination, brightness, an instantaneous flow rate or accumulated usage of such a fuel as a gas, and an instantaneous flow rate or accumulated usage of such a fluid as water. Among these physical quantities, a voltage and a current directly relate to electric power or an amount of electric power, a temperature and a humidity relate, for example, to electric power consumed in an air-conditioner, and illumination and brightness relate, for example, to electric power consumed in a lighting fixture. An instantaneous flow rate and accumulated usage of a fuel relate to an amount of heat generated in combustion thereof, and it further also relates to electric power consumed in an air-conditioner with increase in room temperature due to the amount of heat. Alternatively, in a case that a fuel is supplied to a fuel cell, an instantaneous flow rate and accumulated usage of the fuel relate to generated electric power or an amount of generated electric power. An instantaneous flow rate and accumulated usage of such a fluid as water typically relate to an amount involved with such work as household chores, and further also relates to electric power consumed in a washing machine or a dish washer supporting such work as household chores. Naturally, other than the physical quantities described above, various types of physical quantities can also be managed depending on electrical appliances existing in applications of interest.

Though a power system including one electrical appliance or a plurality of electrical appliances used in premises will be described hereinafter by way of example, the present invention is not applied solely to such a power system. Namely, the present invention is applicable to any configuration so long as it obtains measurement information with the use of a meter.

An electrical appliance herein refers to a concept including any of an appliance operating with externally supplied electric power and an appliance generating power with some kind of energy. The premises include a residential house and an office.

FIG. 1 is a schematic diagram showing an overall configuration of a power system 1 including a management system 2 according to an embodiment of the present invention. Referring to FIG. 1, power system 1 according to the present embodiment is installed in premises such as in a residential house or an office. More specifically, power system 1 includes a plurality of household electrical appliances as electrical appliances consuming electric power. FIG. 1 illustrates as household electrical appliances, an air-conditioner 200A installed in the premises, a television 200B, a microwave oven 200C, a refrigerator 200D, and a lighting fixture 200E (collectively also referred to as "electrical appliance 200"), without limited thereto. Power system 1 includes a photovoltaic power generation apparatus 200X as an electrical appliance generating electric power and a rechargeable battery 200Y for charging/discharging electric power. Rechargeable battery 200Y may be installed in a residential house, or a rechargeable battery for a car may also serve as a rechargeable battery for a residential house.

Power system 1 further includes a power conditioner 200Z connected to a plurality of household electrical appliances, photovoltaic power generation apparatus 200X, rechargeable battery 200Y, and an electricity system (such as commercial electric power provided by a power company), for controlling electric power. Power conditioner 200Z brings electric power generated by photovoltaic power generation apparatus 200X, charge and discharge electric power to and from rechargeable battery 200Y, and electric power purchased from the electricity system in balance, from a point of view of efficiency, and then supplies electric power to electrical appliance 200 through a power line 402.

Management system 2 included in power system 1 includes management system 2 for monitoring and controlling meters 400A to 400E associated with electrical appliance 200, photovoltaic power generation apparatus 200X, rechargeable battery 200Y, and power conditioner 200Z. Management system 2 can communicate data with meters 400A to 400E associated with electrical appliance 200, photovoltaic power generation apparatus 200X, rechargeable battery 200Y, and power conditioner 200Z, through a wired or wireless network 401.

Though any network can be made use of as network 401, such a wired network as Ethernet (trademark) or PLC (Power Line Communications) can be employed. Such a wireless network as wireless LAN (Local Area Network) complying with IEEE 802.11 specifications, ZigBee (trademark), Bluetooth (trademark), or an infrared communication scheme can be employed. A plurality of communication schemes may be combined.

Meter 400 is associated with any electrical appliance 200, and it measures information on power consumption in associated electrical appliance 200 and transmits measurement information to management system 2. Typically, what is called a power measurement device arranged between power line 402 and a plug of electrical appliance 200 for measuring a state of power consumption is employed as meter 400.

In the example shown in FIG. 1, five meters 400A to 400E are electrically connected to power line 402. A plug 250A of air-conditioner 200A is connected to meter 400A, a plug 250B of television 200B is connected to meter 400B, a plug 250C of microwave oven 200C is connected to meter 400C, a plug 250D of refrigerator 200D is connected to meter 400D, and a plug 250E of lighting fixture 200E is connected to meter 400E. Therefore, meters 400A to 400E obtain measurement information on power consumption in air-conditioner 200A, television 200B, microwave oven 200C, refrigerator 200D, and lighting fixture 200E, respectively.

Management system 2 includes a data storage device 300 and a display device 100. Data storage device 300 stores measurement information on power consumption transmitted from meter 400 associated with each electrical appliance 200. Display device 100 provides a user interface for presenting to a user, a state of power consumption/generation in power system 1 or accepting an instruction about power management in power system 1 from the user. Display device 100 displays a graph of power consumption based on measurement information on power consumption stored in data storage device 300. Display device 100 may be portable, attachable/detachable to/from a base arranged on a table, or fixed to a wall of a room. Though FIG. 1 shows an example in which a plurality of display devices 100 are provided, a single display device 100 alone can provide a function or processing according to the present embodiment.

Though FIG. 1 exemplifies management system 2 in which display device 100 and data storage device 300 are separate from each other, such a management device (a home controller by way of example) that these functions are integrated as a single device may be mounted. Such a mount example will be described later.

[B. Device Configuration]

A hardware configuration of a main device constituting power system 1 shown in FIG. 1 will now be described.

(b1: Display Device 100)

Figure 2:
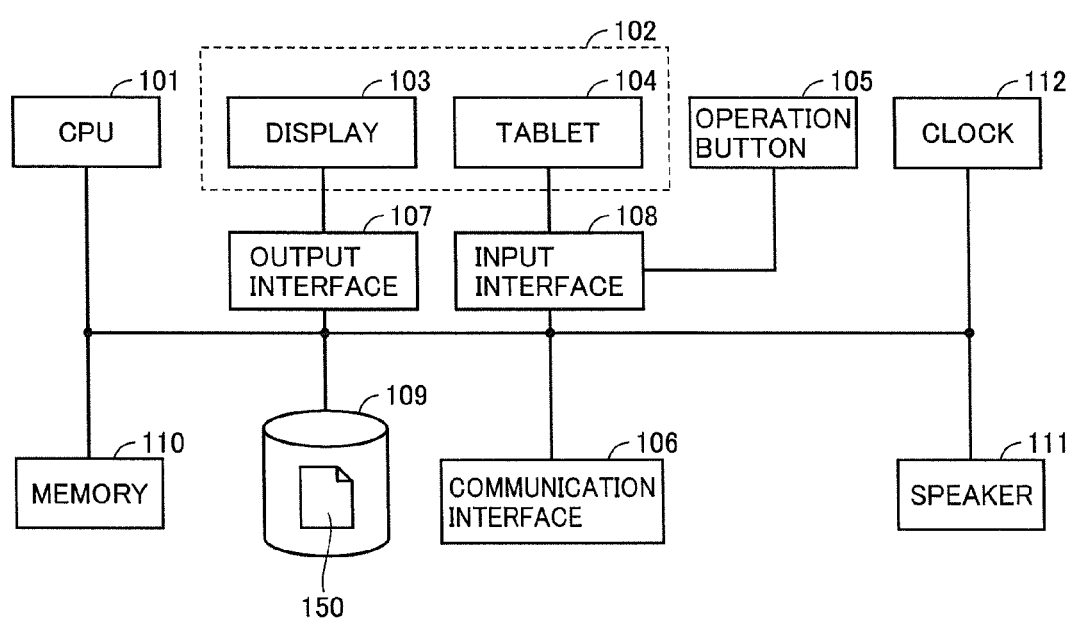
FIG. 2 is a schematic diagram showing a hardware configuration of a display device included in the management system according to the embodiment of the present invention.

FIG. 2 is a schematic diagram showing a hardware configuration of display device 100 included in management system 2 according to the embodiment of the present invention. Referring to FIG. 2, display device 100 includes a CPU (Central Processing Unit) 101, a touch panel 102 including a display 103 and a tablet 104, an operation button 105, a communication interface 106, an output interface 107, an input interface 108, a hard disk 109, a memory 110, and a speaker 111.

CPU 101 is a processing entity responsible for overall processing in display device 100, and provides various functions as will be described later by executing a program stored in advance in memory 110. In response to an operation input from a user through tablet 104 or operation button 105, CPU 101 performs processing indicated through the operation by the user. Such an instruction includes an instruction about activation/inactivation of electrical appliance 200, an instruction for power conditioner 200Z about change in control mode, and an instruction for displaying a current or past power management state.

Touch panel 102 is a device providing a user interface, and it presents to a user various types of information in response an order from CPU 101 and outputs to CPU 101 an instruction input from the user. More specifically, display 103 is implemented, for example, by an LCD (Liquid Crystal Display) or an organic EL (Electro Luminescence) display, and displays an image on its display surface. Tablet 104 detects a touch operation with a user's finger and outputs a coordinate value indicating a position of the touch operation to CPU 101. In the present embodiment, tablet 104 is provided in correspondence with a display surface of display 103. Display device 100, however, does not necessarily have to include a touch panel, and it should only be able to present various types of information to the user.

Operation button 105 is input means for accepting an operation from a user, and typically, one operation button or a plurality of operation buttons is/are arranged on a surface of display device 100. Typically, operation button 105 includes a plurality of buttons or keys such as an enter button, a back button, a direction button, and a numeric key. When an operation by a user is accepted, operation button 105 outputs to CPU 101, information indicating the operation by the user.

Communication interface 106 communicates data with data storage device 300, meter 400, photovoltaic power generation apparatus 200X, rechargeable battery 200Y, and power conditioner 200Z in response to an order from CPU 101. More specifically, communication interface 106 makes use of Ethernet (trademark), PLC (Power Line Communications), wireless LAN (Local Area Network) complying with IEEE 802.11 specifications, ZigBee (trademark), Bluetooth (trademark), or an infrared communication scheme as described above.

Output interface 107 mediates exchange of an internal command between CPU 101 and display 103. Input interface 108 mediates exchange of an internal command between tablet 104 and/or operation button 105 and CPU 101.

Hard disk 109 stores various types of data necessary for information processing in display device 100. Details of the various types of data will be described later.

Memory 110 is implemented by a RAM (Random Access Memory) representing a volatile storage device or a ROM (Read-Only Memory) representing a non-volatile storage device, and stores a program executed by CPU 101 or work data necessary for execution of a program by CPU 101.

Speaker 111 is an audio device and outputs voice and sound in response to an order from CPU 101. A clock 112 is time counting means and it gives a response of current date and time to CPU 101 in response to an order from CPU 101.

Hard disk 109 and/or memory 110 may be implemented by a storage medium connected through a communication interface. For such a storage medium, a semiconductor storage medium such as a flash memory, a mask ROM, an EPROM (Electronically Programmable Read-Only Memory), an EEPROM (Electronically Erasable Programmable Read-Only Memory), or an IC (Integrated Circuit) card, an optical disc storage medium such as a CD-ROM (Compact Disc-Read Only Memory) or a DVD-ROM (Digital Versatile Disk-Read Only Memory), a magneto-optical disc storage medium such as an MO (Magnetic Optical Disc) or an MD (Mini Disc), or a magnetic storage medium such as an FD (Flexible Disk), a magnetic tape, or a cassette tape can be employed.

Information processing in display device 100 is implemented as CPU 101 executes a program in coordination with a peripheral hardware component. In general, such a program is installed in advance in memory 110.

Such a program may be provided as distributed as stored in any storage medium. Alternatively, such a program may be provided by downloading from a server device (or another device) connected to the Internet. Namely, a stored program is read from a storage medium or a program is obtained through downloading from a server device, and then once stored in memory 110. Then, CPU 101 extracts the program stored in memory 110 in an executable format and then executes the program. As a storage medium storing such a program, a semiconductor storage medium such as a flash memory, a mask ROM, an EPROM, an EEPROM, or an IC card, an optical disc storage medium such as a CD-ROM or a DVD-ROM, a magneto-optical disc storage medium such as an MO or an MD, or a magnetic storage medium such as an FD, a magnetic tape, or a cassette tape can be employed.

Instead of installing in advance a program in memory 110, a program stored in another system or a device may be read and executed by CPU 101.

The function according to the present embodiment may be implemented as a program read from a storage medium is written in a memory mounted on a function expansion board or a function expansion unit attached to a computer, and thereafter an operation portion (such as a CPU) mounted on the function expansion board or the function expansion unit performs necessary processing in its entirety or in part in accordance with the program.

Not only all functions according to the present embodiment are implemented as CPU 101 executes a program, but also the function according to the present embodiment may be implemented as an operating system (OS) executed on a computer performs necessary processing in its entirety or in part in accordance with the program.

In a case that software as described above implements the function according to the present embodiment, a program itself read from a storage medium or a storage medium storing a program implements one form of the present invention.

The program herein includes not only a program directly executable by CPU 101, but also a program in the form of a source program, a compressed program, and an encrypted program.

(b2: Data Storage Device 300)

Figure 3:
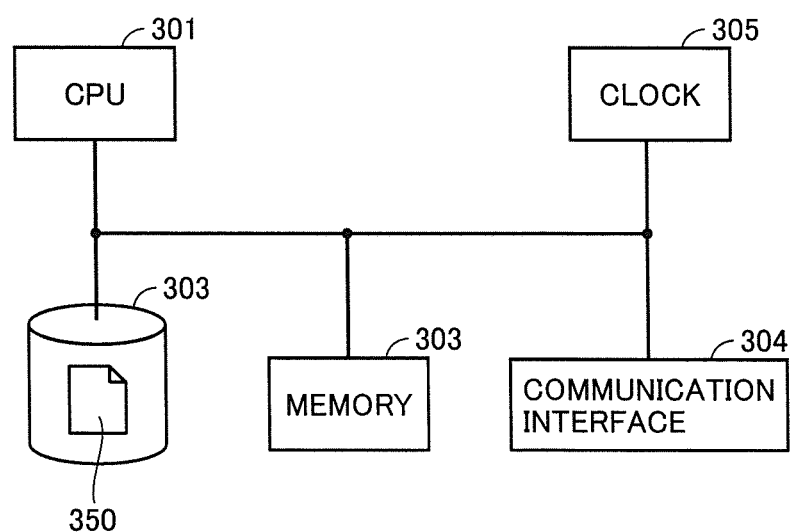
FIG. 3 is a schematic diagram showing a hardware configuration of a data storage device included in the management system according to the embodiment of the present invention.

FIG. 3 is a schematic diagram showing a hardware configuration of data storage device 300 included in management system 2 according to the embodiment of the present invention. Referring to FIG. 3, data storage device 300 includes a CPU 301, a hard disk 302, a memory 303, a communication interface 304, and a clock 305.

CPU 301 is a processing entity responsible for overall processing in data storage device 300, and provides various functions as will be described later by executing a program stored in advance in memory 303.

Hard disk 302 stores measurement information on power consumption transmitted from meters 400A to 400E. Details of processing for storing this measurement information will be described later.

Memory 303 is implemented by a RAM representing a volatile storage device or a ROM representing a non-volatile storage device and stores a program executed by CPU 301 or work data necessary for execution of a program by CPU 301.

Communication interface 304 communicates data with display device 100, data storage device 300, meter 400, photovoltaic power generation apparatus 200X, rechargeable battery 200Y, and power conditioner 200Z in response to an order from CPU 301. Since details thereof are similar to those of communication interface 106 (FIG. 2) described above, detailed description will not be repeated.

Clock 305 is time counting means and it gives a response of current date and time to CPU 301 in response to an order from CPU 301.

As described in connection with hard disk 109 and/or memory 110 shown in FIG. 2, hard disk 302 and/or memory 303 may be implemented by a storage medium connected through a communication interface. Detailed description of a storage medium will not be repeated here.

Information processing in data storage device 300 is implemented as CPU 301 executes a program in coordination with a peripheral hardware component. In general, such a program is installed in advance in memory 303. Since distribution and processing in execution of such a program are similar to those of the program directed to display device 100 described above, detailed description will not be repeated.

(b3: Meter 400)

Figure 4:
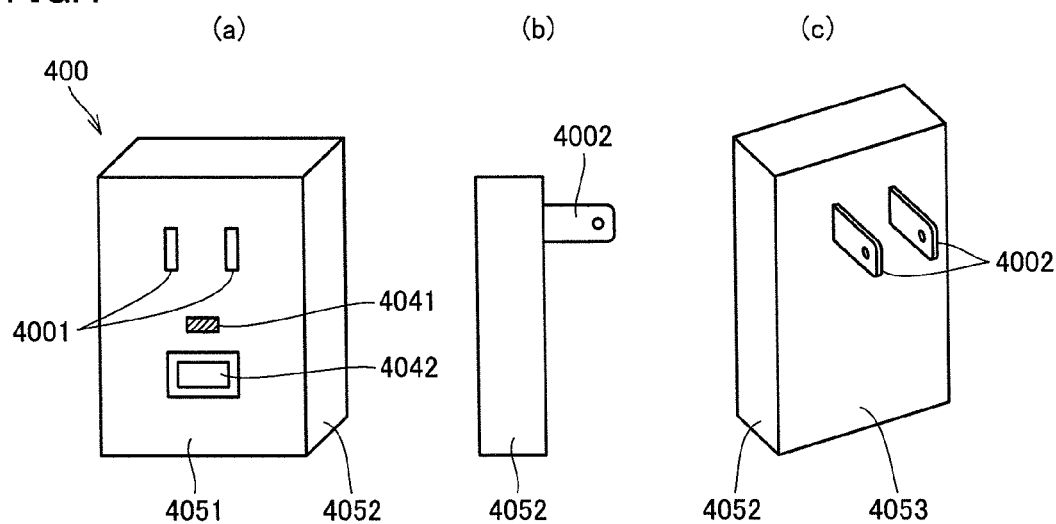
FIG. 4 is an external view of a meter included in the management system according to the embodiment of the present invention.
Figure 5:
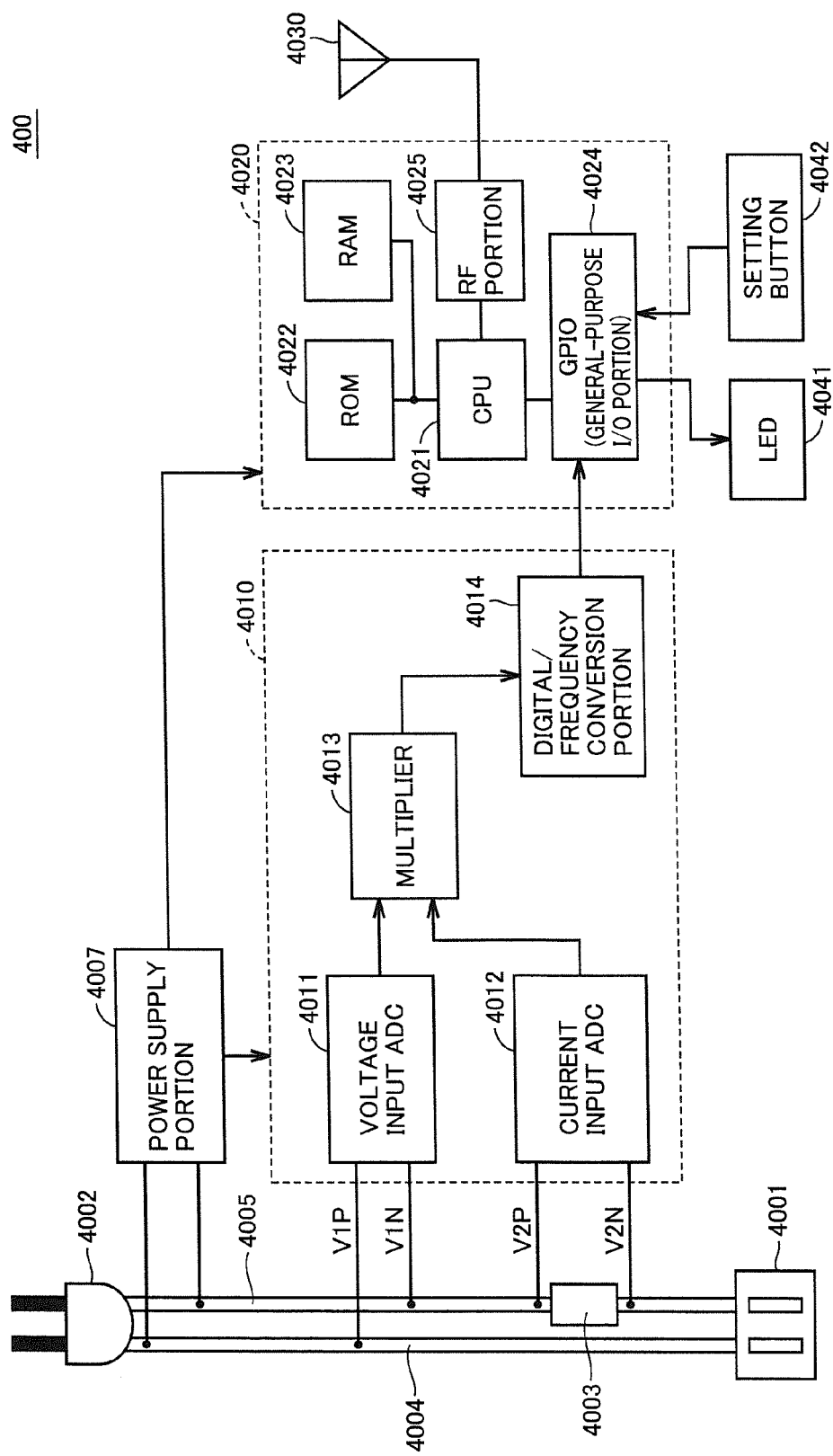
FIG. 5 is a schematic diagram showing a hardware configuration of the meter included in the management system according to the embodiment of the present invention.

FIG. 4 is an external view of meter 400 included in management system 2 according to the embodiment of the present invention. Here, FIG. 4 (a) shows a perspective view including a socket 4001 of meter 400, FIG. 4 (b) shows a side view of meter 400, and FIG. 4 (c) shows a perspective view including a plug 4002 of meter 400. FIG. 5 is a schematic diagram showing a hardware configuration of meter 400 included in management system 2 according to the embodiment of the present invention.

Referring to FIGS. 4 (a) to 4 (c), meter 400 is arranged as interposed between a socket for supplying electric power which flows through power line 402 and a plug of electrical appliance 200. More specifically, referring to FIG. 4 (a), socket 4001 for reception of a plug is provided in a surface 4051 of meter 400. Referring to FIGS. 4 (b) and 4 (c), plug 4002 is provided in a surface 4053 which is a surface opposite to surface 4051 of meter 400. The plug of electrical appliance 200 is inserted in socket 4001 and plug 4002 is inserted in a socket (receptacle/outlet) for supplying electric power through power line 402 provided in premises.

Meter 400 having a smaller thickness is preferred, and hence a thickness of a side surface 4052 is designed to be as small as possible.

An LED 4041 and a setting button 4042 are further provided on surface 4051 of meter 400. LED 4041 indicates a status of data processing in meter 400. More specifically, in accordance with a status of data processing, LED 4041 is turned on or off, is caused to blink, is varied in period of blinking, or is varied in color of emission. Setting button 4042 is input means for accepting an operation from a user, and when it is operated by a user, initial setting in meter 400 is started.

Referring to FIG. 5, meter 400 includes, in addition to socket 4001, plug 4002, LED 4041, and setting button 4042, a pair of main lines 4004 and 4005 electrically connecting socket 4001 and plug 4002 to each other, a shunt resistor 4003 interposed in main line 4005, a power supply portion 4007, an electric power detection portion 4010, a communication module 4020, and an antenna 4030.

Electric power detection portion 4010 detects electric power which flows from plug 4002 to socket 4001. More specifically, electric power detection portion 4010 includes a voltage input ADC (Analog to Digital Converter) 4011, a current input ADC 4012, a multiplier 4013, and a digital/frequency conversion portion 4014.

Voltage input ADC 4011 is connected to main lines 4004 and 4005 through lines V1P and V1N. Voltage input ADC 4011 outputs a digital signal indicating a voltage produced between main lines (potential difference) to multiplier 4013.

Current input ADC 4012 is electrically connected through lines V2P and V2N to opposing ends of shunt resistor 4003 interposed in main line 4005. Shunt resistor 4003 is a small (several hundred micro $\Omega$) resistor used for measuring a value of a current which flows. Current input ADC 4012 outputs a digital signal indicating a value for a current which flows through shunt resistor 4003 to multiplier 4013.

Multiplier 4013 multiplies a digital signal (a voltage value) from voltage input ADC 4011 by a digital signal (a current value) from current input ADC 4012, and outputs a digital signal indicating a resultant value (consumed power/unit: W or kW) to digital/frequency conversion portion 4014.

Digital/frequency conversion portion 4014 converts the digital signal from multiplier 4013 into a frequency signal and outputs the resultant frequency signal to communication module 4020.

Power supply portion 4007 supplies electric power to each component in meter 400. Power supply portion 4007 is connected to main lines 4004 and 4005, and makes use of some of electric power which flows from plug 4002 to socket 4001 as electric power for operation of meter 400. Power supply portion 4007 converts AC power into DC power and thereafter supplies the DC power to electric power detection portion 4010 and communication Module 4020.

Communication module 4020 sends a radio signal indicating consumed power in an electrical appliance connected to socket 4001, which was calculated by electric power detection portion 4010, through antenna 4030. More specifically, communication module 4020 includes a CPU 4021, a ROM 4022, a RAM 4023, a GPIO (General Purpose Input/Output) 4024, and a radio frequency (RF) portion 4025.

GPIO 4024 receives a frequency signal input from digital/frequency conversion portion 4014 and outputs information on the frequency signal to CPU 4021.

CPU 4021 data-converts information on the frequency signal from GPIO 4021 in accordance with a prescribed logic, and outputs a result thereof to RF portion 4025. RF portion 4025 generates a radio signal by modulating carrier waves based on a result of data conversion from CPU 4021. The radio signal generated in RF portion 4025 is transmitted through antenna 4030.

CPU 4021 implements processing as described above by executing a program stored in advance in ROM 4022. RAM 4023 stores work data necessary for execution of a program by CPU 4021.

[C. Problems]

Problems addressed by management system 2 according to the present embodiment will now be described.

Figure 6:
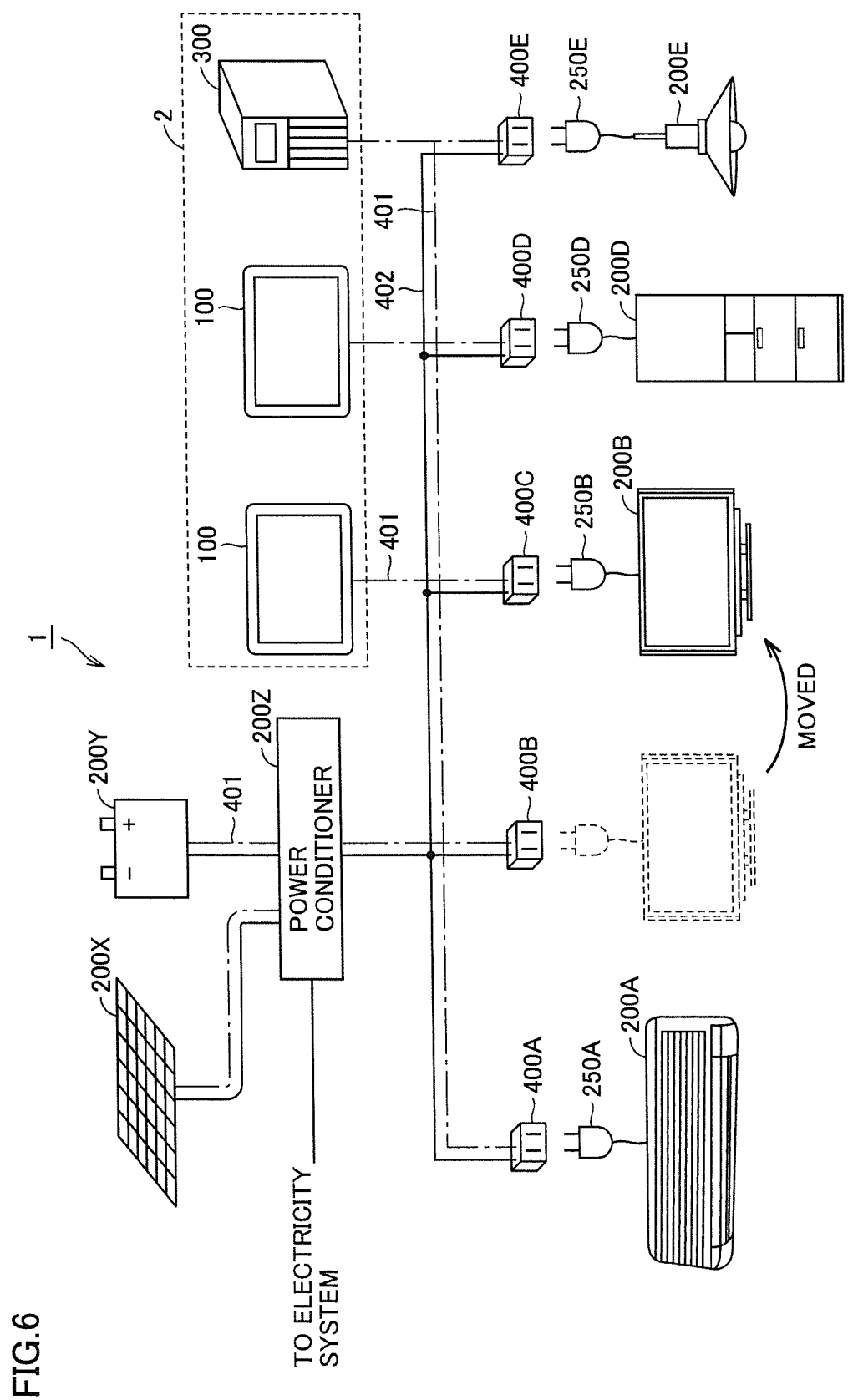
FIG. 6 is a diagram for illustrating a problem addressed by the embodiment of the present invention.
Figure 7:
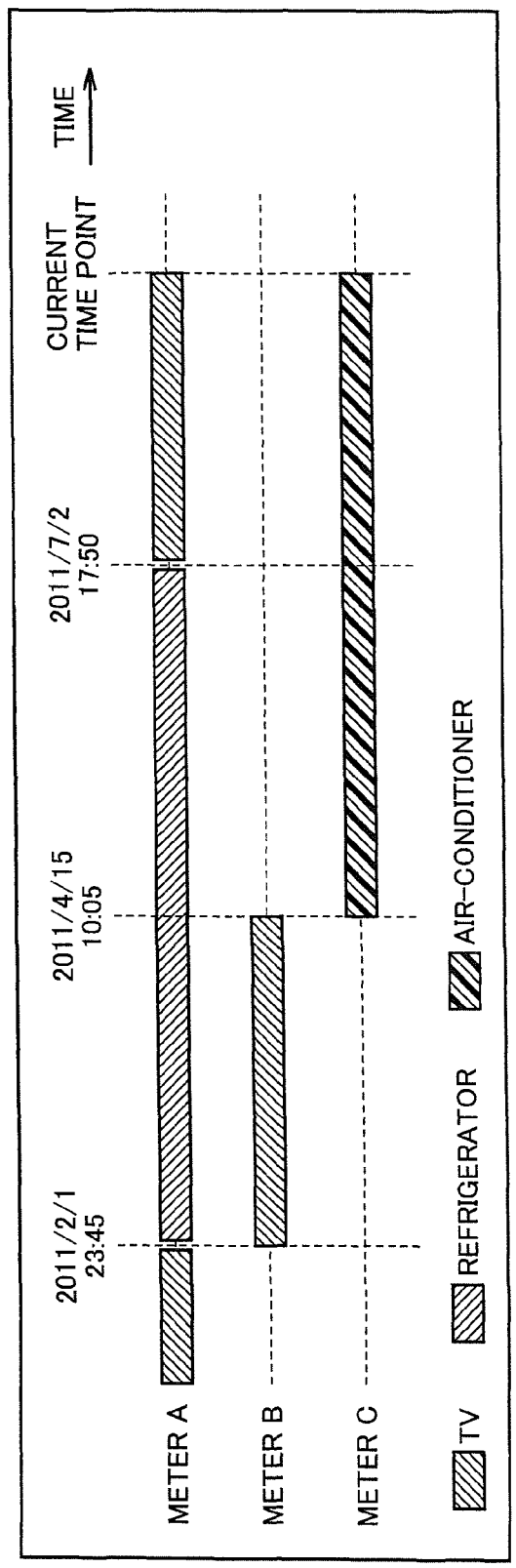
FIG. 7 is a diagram for illustrating a problem addressed by the embodiment of the present invention.

FIGS. 6 and 7 are diagrams for illustrating problems addressed by the embodiment of the present invention.

For example, electrical appliance 200 connected to the same meter 400 may be changed by replacement purchase/additional purchase of electrical appliance 200 or redecoration of a room. Referring to FIG. 6, for example, it is possible that a connection target of television 200B is changed to meter 400C by changing a position of installation of television 200B connected to meter 400B.

As described above, meter 400 can easily measure information on power consumption in electrical appliance 200 as arranged between a socket (receptacle/outlet) for supplying electric power which is provided in premises and a plug of electrical appliance 200. Therefore, a position of arrangement of meter 400 can relatively freely be determined. Therefore, with attention being paid to a certain meter 400, electrical appliance 200 to be measured may frequently be changed.

Measurement information transmitted from meter 400 basically does not include information for specifying electrical appliance 200 to be measured. Namely, in general, meter 400 does not have information for identifying connected electrical appliance 200.

A conventional system has not been able to address change in electrical appliance 200 connected to such a meter 400. Namely, though information on an electrical appliance connected to each meter may have been set in the conventional system, it has not held information on which electrical appliance 200 had been connected to which meter 400 and when it had been connected, and hence incorrect information may be output to a user.

For example, it is possible that electrical appliances connected to three meters A to C are changed as shown in FIG. 7. In FIG. 7, to meter A, a refrigerator was connected until 17:50 on Jul. 2, 2011 and a television is subsequently connected.

In a case that history of electrical appliance 200 which has been connected to meter A is not appropriately managed, for example, when information on power consumption (such as a graph showing temporal transition of an amount of consumed power) is output at the "current" stage, incorrect information will be displayed. Namely, information measured for the refrigerator is introduced in a graph for the television. Alternatively, information measured for the television may be introduced in a graph for the refrigerator.

[D. Outlines of Solving Means]

Management system 2 according to the present embodiment solves the problem of introduction of measurement information as described above, by appropriately managing association between meter 400 and electrical appliance 200. The following two approaches are considered for solving such a problem.

Figure 8:
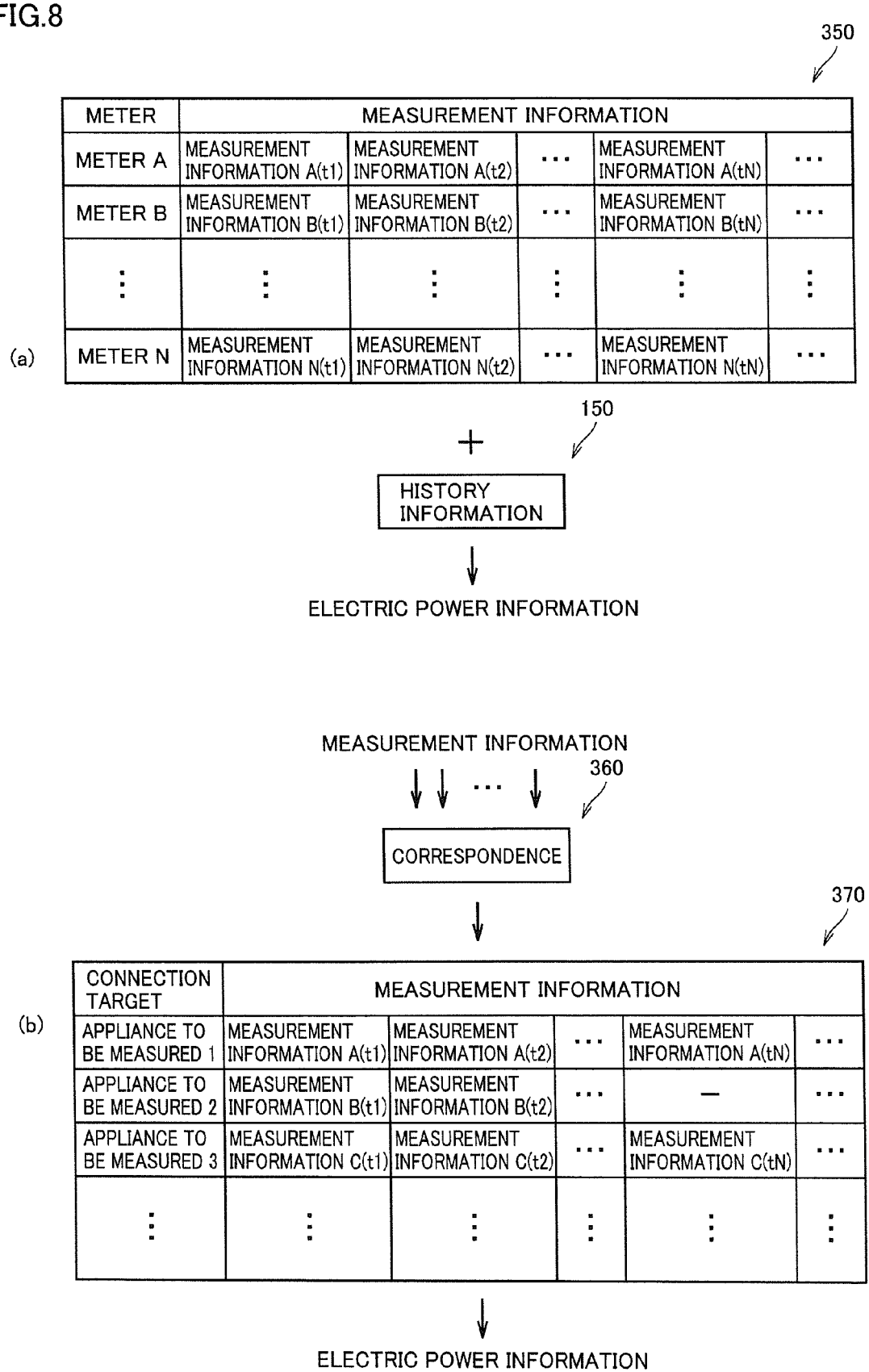
FIG. 8 is a diagram for illustrating outlines of solving means in the embodiment of the present invention.

FIG. 8 is a diagram for illustrating outlines of solving means in the embodiment of the present invention. FIG. 8 (*a*) shows a first approach and FIG. 8 (*b*) shows a second approach.

Referring to FIG. 8 (*a*), in the first approach, measurement information is chronologically stored for each meter 400 (a measurement information table 350) and history information on association between meter 400 and electrical appliance 200 is held (a history information table 150). When output of electric power information on any electrical appliance 200 is requested, contents in history information table 150 are referred to and necessary measurement information is extracted from measurement information table 350, such that electric power information on selected electrical appliance 200 is generated and output.

Thus, by saving measurement information measured by meter 400 as it is in measurement information table 350, even an error in association between meter 400 and electrical appliance 200 (appliance to be measured) can subsequently be addressed. Any of a case that the same management entity manages measurement information table 350 and history information table 150 and a case that different management entities manage them, respectively, can be addressed, For example, such a form that data storage device 300 holds measurement information table 350 and display device 100 holds history information table 150 can be adopted.

Referring to FIG. 8 (*b*), in the second approach, measurement information transmitted from each meter 400 is chronologically stored in association with electrical appliance 200 (a measurement information table 370). In order to generate such a measurement information table 370, correspondence between meter 400 and electrical appliance 200 (appliance to be measured) (a correspondence table 360) is set in advance, and measurement information transmitted from each meter 400 is successively stored in measurement information table 370 with reference to this correspondence table 360. Then, when output of electric power information on any electrical appliance 200 is requested, electric power information on selected electrical appliance 200 is generated and output based on measurement information table 370.

Management of measurement information can further be facilitated by using such a correspondence table 360.

A first embodiment representing a more specific mount example of the first approach and a variation thereof as well as a second embodiment representing a more specific mount example of the second approach and a variation thereof will be described below in detail.

[E. First Embodiment]

(e1: Outlines)

Management system 2 according to the first embodiment of the present invention manages electric power in connection with power consumption in at least one electrical appliance 200. Management system 2 has a function for chronologically storing for each meter 400, measurement information on power consumption in electrical appliance 200 transmitted from meter 400 associated with each electrical appliance 200 (measurement information table 350) and a function for storing history information on association between the meter and the electrical appliance (history information table 150). By way of example, in management system 2 shown in FIG. 1, data storage device 300 manages measurement information table 350 and display device 100 manages history information table 150. Management system 2 further has a function for outputting, in response to selection of electrical appliance 200 by a user, electric power information on selected electrical appliance 200 by extracting measurement information corresponding to selected electrical appliance 200 from measurement information stored for each meter 400 (measurement information table 350). This function for outputting electric power information may exist in any one or both of display device 100 and data storage device 300. Display device 100 having a function for outputting electric power information will be described below as a typical configuration.

(e2: Data Structure)

FIG. 9 is a diagram showing one example of a data structure in a table used in management system 2 according to the first embodiment of the present invention. FIG. 9 (a) shows one example of measurement information table 350 and FIG. 9 (b) shows one example of history information table 150.

Data storage device 300 chronologically stores measurement information on power consumption in each electrical appliance 200 for each meter 400. Namely, measurement information is successively stored at prescribed intervals for each meter 400 in measurement information table 350 shown in FIG. 9 (a). More specifically, measurement information table 350 includes a column 3501 storing identification information of meter 400 and a column 3502 successively storing measurement information transmitted from corresponding meter 400.

Column 3501 stores information for identifying each of meters 400 under the control of management system 2. Though FIG. 9 (a) shows an example where a name of meter 400 is stored in column 3501, a network address (a MAC address or an IP address) may be used.

Column 3502 successively stores measurement information transmitted from each meter 400 in a row corresponding to meter 400 which is a sender of the measurement information. Namely, measurement information A(t1) at time t1 measured by a meter A is stored in a row corresponding to meter A and measurement information A(t2) at time t2 measured by meter A is stored in a subsequent column in the same row. Measurement information measured by other meters 400 is also similarly stored.

History information table 150 shown in FIG. 9 (b) stores history information indicating when each electrical appliance 200 (appliance to be measured) was connected to which meter 400. Namely, history information table 150 stores for each electrical appliance 200, time of activation of association with meter 400 and information for identifying associated meter 400.

More specifically, history information table 150 includes a column 1501 storing identification information of electrical appliance 200 (appliance to be measured), a column 1502 showing time and date when connection of corresponding electrical appliance 200 was started, a column 1503 showing time and date when connection of corresponding electrical appliance 200 ended, and a column 1504 storing identification information of meter 400 to which corresponding electrical appliance 200 is connected. As shown in the column for an "appliance to be measured 1" in FIG. 9 (b), each time a connection target of the same electrical appliance 200 (appliance to be measured) is changed, contents involved with change (identification information of meter 400 which is a connection target, time and date of start of connection, and time and date of end of connection) are updated.

Thus, management system 2 according to the present embodiment stores history information on association between meter 400 and electrical appliance 200.

Since management system 2 according to the present embodiment should only be able to hold data stored in measurement information table 350 and history information table 150 described above, any data structure can be adopted without limited to the data structure shown in FIG. 9. A single device may store both of measurement information table 350 and history information table 150.

(e3: Measurement Information)

In management system 2 according to the present embodiment, measurement information table 350 and history information table 150 are used to output electric power information on electrical appliance 200 selected by a user. First, measurement information measured by meter 400 and a method of transmitting the same will be described.

As described with reference to FIG. 5, meter 400 basically measures electric power consumed in a connected electrical appliance (instantaneous consumed power (unit: W or kW)). By accumulating this instantaneous consumed power over a prescribed time period, an amount of consumed power (unit: Wh or kWh) in the electrical appliance is calculated.

Display device 100 can display any of instantaneous consumed power and an amount of consumed power in each electrical appliance. A plurality of electrical appliances can also be grouped and instantaneous consumed power and an amount of consumed power in the group as a whole can also be displayed.

Therefore, a mount example of measurement information on corresponding electrical appliance 200 transmitted from meter 400 is, for example, as follows (without limited to the example below).

(1) As meter 400 accumulates instantaneous consumed power in electrical appliance 200 over a transmission period, an amount of consumed power for each transmission period is periodically transmitted as measurement information. Namely, an amount of electric power (unit: Wh or kWh) consumed in electrical appliance 200 from previous transmission until present transmission is transmitted every prescribed period.

(2) Meter 400 measures instantaneous consumed power in electrical appliance 200 (unit: W or kW) every prescribed period (for example, every 1 second) and transmits the measured instantaneous power consumption as measurement information in a transmission period the same as a measurement period.

(3) Meter 400 measures instantaneous consumed power in electrical appliance 200 every prescribed period (for example, every 1 second) and transmits a plurality of pieces of instantaneous consumed power measured from previous transmission until present transmission as measurement information in a transmission period longer than the measurement period.

(4) Meter 400 measures instantaneous consumed power in electrical appliance 200 every prescribed period (for example, every 1 second) and transmits as measurement information, average instantaneous consumed power obtained by averaging a plurality of pieces of instantaneous consumed power measured from previous transmission until present transmission, in a transmission period longer than the measurement period.

(5) Measurement information including an amount of consumed power resulting from accumulation of a plurality of pieces of instantaneous consumed power measured from previous transmission until present transmission is transmitted together with instantaneous consumed power or average instantaneous consumed power in (3) or (4). Furthermore, an average value, a minimum value, or a maximum value of a plurality of pieces of instantaneous consumed power may be added.

Though time information obtained by meter 400 with some means may be added to measurement information, in general, when data storage device 300 receives measurement information, that time is obtained from clock 305 and stored in measurement information table 350 in association with the received measurement information.

Any protocol can be adopted for exchange of measurement information between data storage device 300 and meter 400. Typically, such a configuration that meter 400 broadcasts a packet including a result of measurement by the meter itself and data storage device 300 receives this packet is adopted. Data storage device 300 may periodically polls each meter 400.

(e4: Processing for Outputting Electric Power Information)

Figure 10:
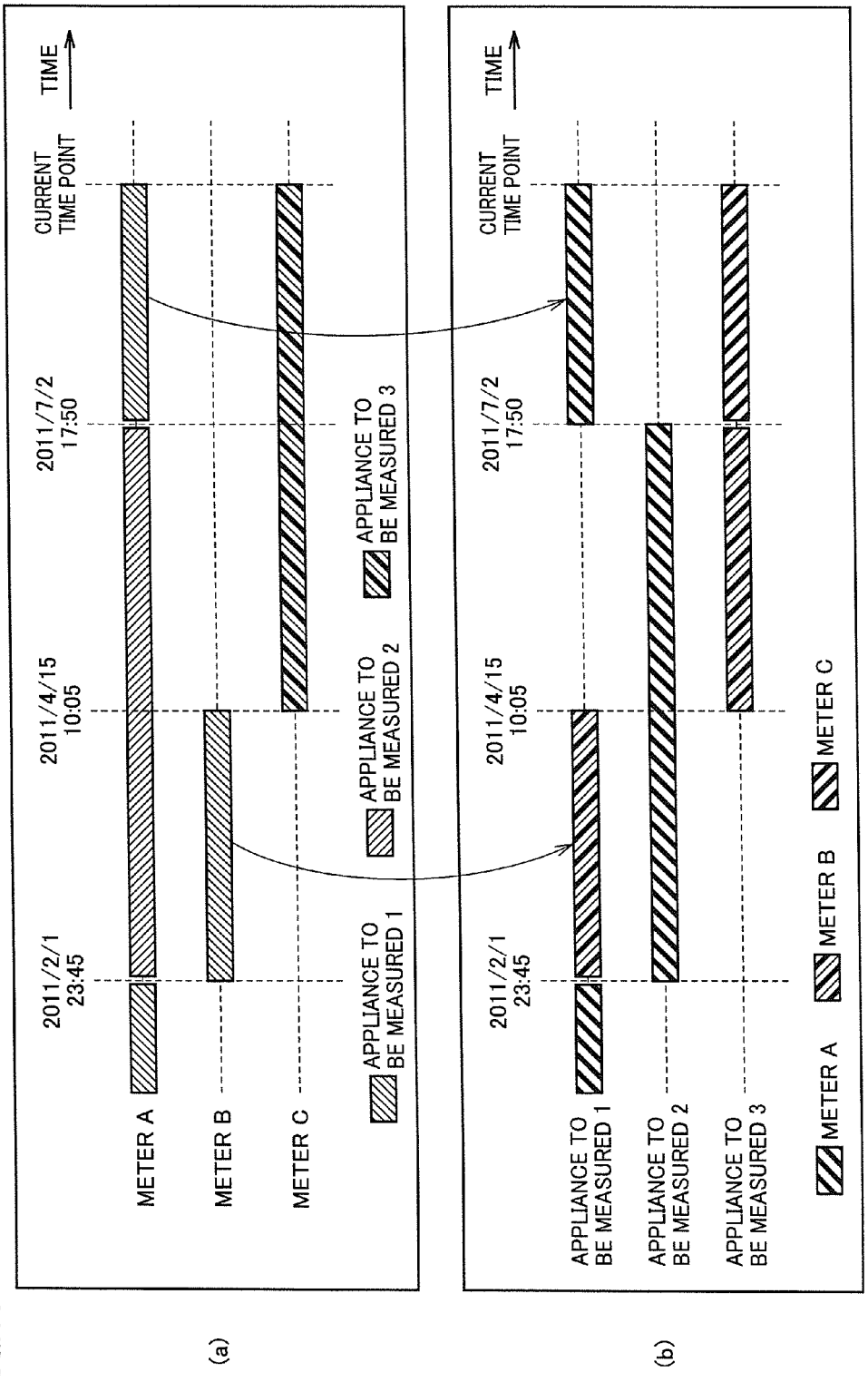
FIG. 10 is a diagram for illustrating processing for outputting electric power information in the management system according to the first embodiment of the present invention.

Processing for outputting electric power information with the use of measurement information table 350 and history information table 150 shown in FIG. 9 will now be described. FIG. 10 is a diagram for illustrating processing for outputting electric power information in management system 2 according to the first embodiment of the present invention.

FIG. 10 (a) schematically shows a type of measurement information stored in measurement information table 350. By way of example, to meter A, appliance to be measured 1 is connected until 23:45 on Feb. 1, 2011, an appliance to be measured 2 is thereafter connected until 17:50 on Jul. 2, 2011, and appliance to be measured 1 is again connected thereafter until the current time point. To a meter B, appliance to be measured 1 is connected from 23:45 on Feb. 1, 2011 until 10:05 on Apr. 15, 2011. To a meter C, an appliance to be measured 3 is connected from 10:05 on Apr. 15, 2011 until the current time point.

As described above, history information table 150 holds history information indicating history about association between meter 400 and electrical appliance 200 as shown in FIG. 10 (a). Display device 100 extracts measurement information during a necessary time period from measurement information table 350 with reference to the history information stored in this history information table 150 and outputs electric power information.

FIG. 10 (b) shows a procedure for generating electric power information for each of appliances to be measured 1 to 3. In the example shown in FIG. 10, for example, for appliance to be measured 1, electric power information is generated by using measurement information from 23:45 on Feb. 1, 2011 until 10:05 on Apr. 15, 2011 stored in association with meter B and measurement information from 17:50 on Jul. 2, 2011 until the current time point stored in association with meter A. This is also the case with other appliances to be measured 2 and 3.

One example of output electric power information will now be described.

Figure 11:
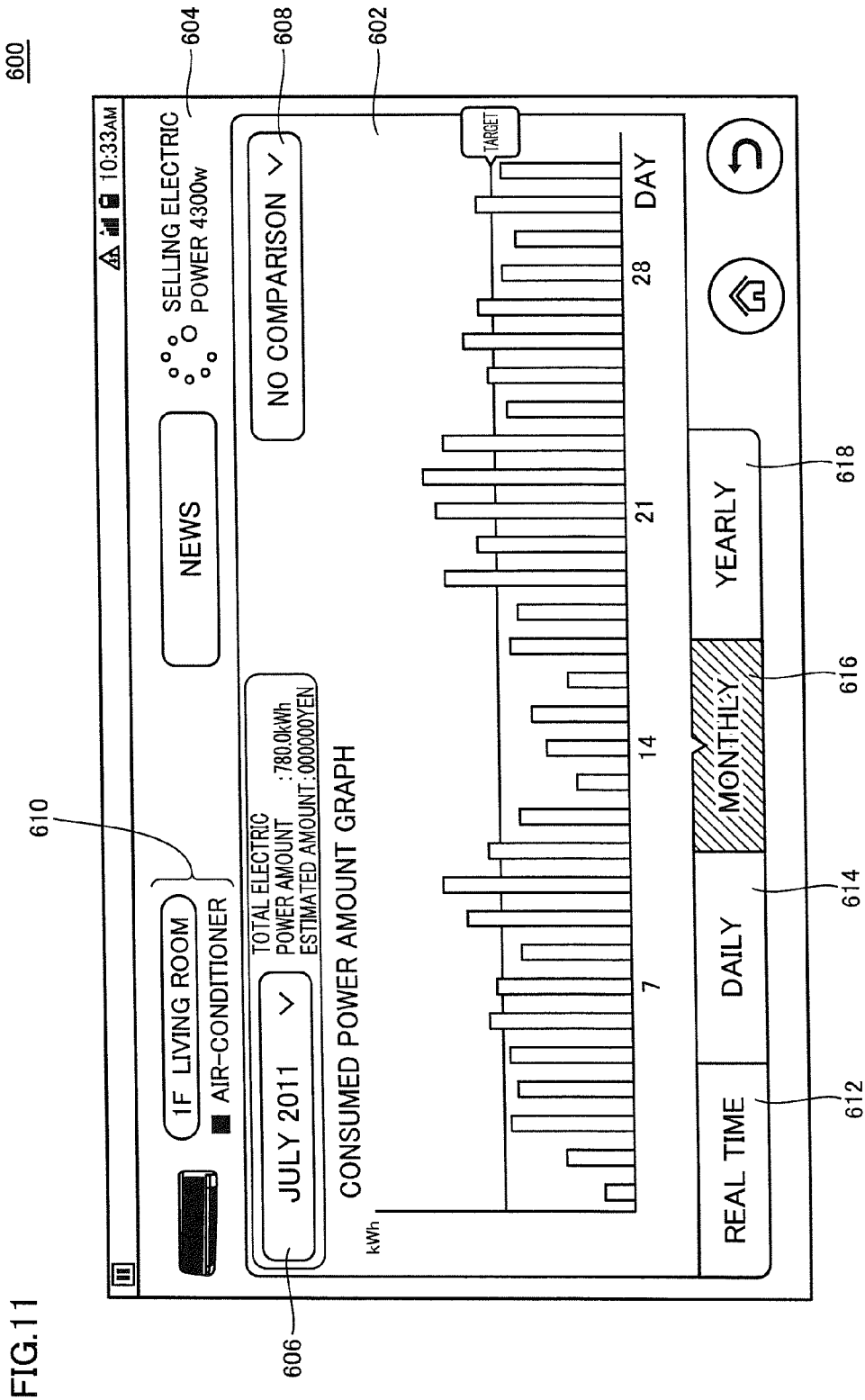
FIG. 11 is a diagram showing a display example of electric power information provided in the management system according to the first embodiment of the present invention.

FIG. 11 is a diagram showing a display example of electric power information provided in management system 2 according to the first embodiment of the present invention. A screen 600 for displaying electric power information shown in FIG. 11 is displayed on touch panel 102 of display device 100. This display screen 600 includes a graph 602 showing history of an amount of power consumption in designated electrical appliance 200 over a time period designated by a user. This graph 602 shows an amount of power consumption in electrical appliance 200 selected as the user operates a selection icon 610. An amount of power consumption for a time period selected as the user operates a time period icon 606 is shown.

Display screen 600 includes buttons 614, 616, and 618 for selecting a display time period. Buttons 614, 616, and 618 designate "daily", "monthly", and "yearly", respectively. "Daily" shows change over time in amount of power consumption in one designated day, "monthly" shows change over time in amount of power consumption in one designated month, and "yearly" shows change over time in amount of power consumption in one designated year. In accordance with a time period selected with this button 614, 616, 618, display contents of time period icon 606 are also updated.

As the user selects a comparison instruction icon 608, amounts of power consumption in a plurality of electrical appliances 200 are displayed in a graph on the same temporal axis. Here, different colors or patterns are provided for distinction (comparison) of each electrical appliance 200.

Display screen 600 includes a state indication 604 indicating a current state of supply and demand of electric power in power system 1. As the user selects a button 612, a current amount of consumed power or consumed power in the designated electrical appliance is displayed.

Without limited to display screen 600 as described above, electric power information can be output (presented) to the user in various forms, based on measurement information measured by meter 400. A form of output of electric power information may include not only display on a screen but also transmission of information via an electronic mail, disclosure of information on the Web, and print output on a paper medium with the use of a printer.

(e5: Processing Procedure)

A processing procedure in management system 2 according to the present embodiment will now be described.

Figure 12:
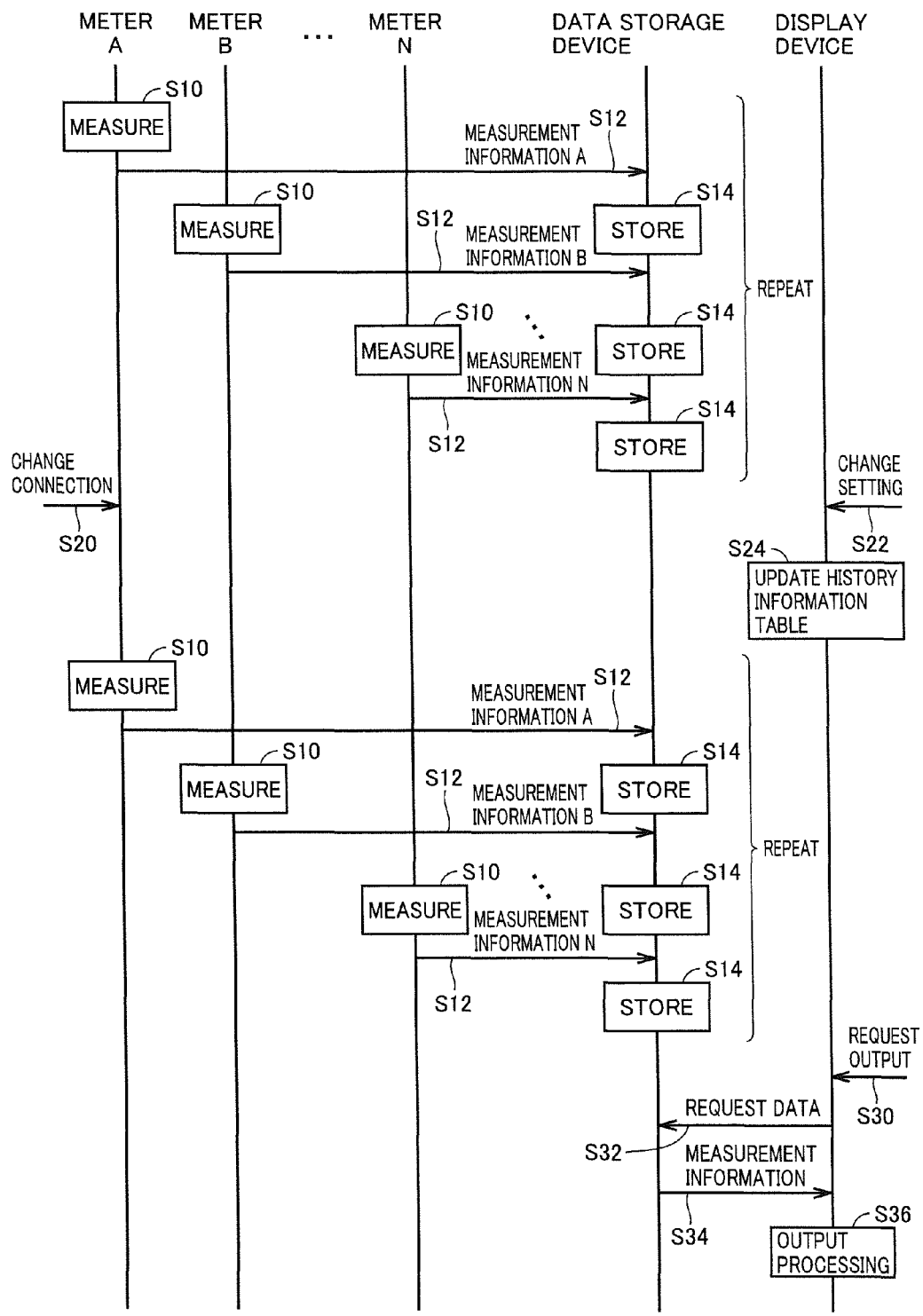
FIG. 12 is a sequence diagram showing a processing procedure in the management system according to the first embodiment of the present invention.

FIG. 12 is a sequence diagram showing a processing procedure in management system 2 according to the first embodiment of the present invention. Referring to FIG. 12, each of one or a plurality of meter(s) 400 measures information on power consumption in connected electrical appliance 200 (step S10), and transmits measurement information obtained through measurement to data storage device 300 (step S12). Data storage device 300 chronologically stores for each meter 400, measurement information received from each meter 400 (step S14). Processing in steps S10 to S14 is repeated every prescribed period or every prescribed condition.

Thereafter, it is assumed that the user has changed electrical appliance 200 connected to any meter 400 (step S20). Here, the user performs an operation in display device 100 for changing setting involved with this change (step S22). Then, display device 100 updates contents in history information table 150 in accordance with the operation for changing setting performed by the user (step S24). During and after change in contents in history information table 150 as well, the processing in steps S10 to S14 is repeated every prescribed period or every prescribed condition.

Thereafter, it is assumed that the user has performed an operation in display device 100 for requesting output of electric power information (step S30). This requesting operation includes also selection of electrical appliance 200 (appliance to be measured) to which electric power information is to be output. In response to this requesting operation, display device 100 retrieves history information on selected electrical appliance 200 with reference to history information table 150, and requests necessary measurement information among pieces of measurement information for each meter 400 stored in data storage device 300, based on the history information obtained as a result of retrieval (step S32). Data storage device 300 extracts necessary measurement information from measurement information table 350 in accordance with the requested measurement information and transmits the measurement information to display device 100 (step S34). Display device 100 outputs electric power information on electrical appliance 200 selected by the user based on the measurement information received from data storage device 300 (step S36).

When the user has requested output of other electric power information to display device 100, requested electric power information is created and output through processing the same as described above.

(e6: Operation for Changing Setting)

An exemplary operation for changing setting which is performed at the time when electrical appliance 200 connected to meter 400 is changed will now be described.

Management system 2 according to the present form provides a user interface screen for accepting designation of associated electrical appliance 200 for each meter 400. FIGS. 13 to 17 are each a diagram showing one example of a user interface screen involved with an operation for changing setting which is provided in management system 2 according to the first embodiment of the present invention.

Figure 13:
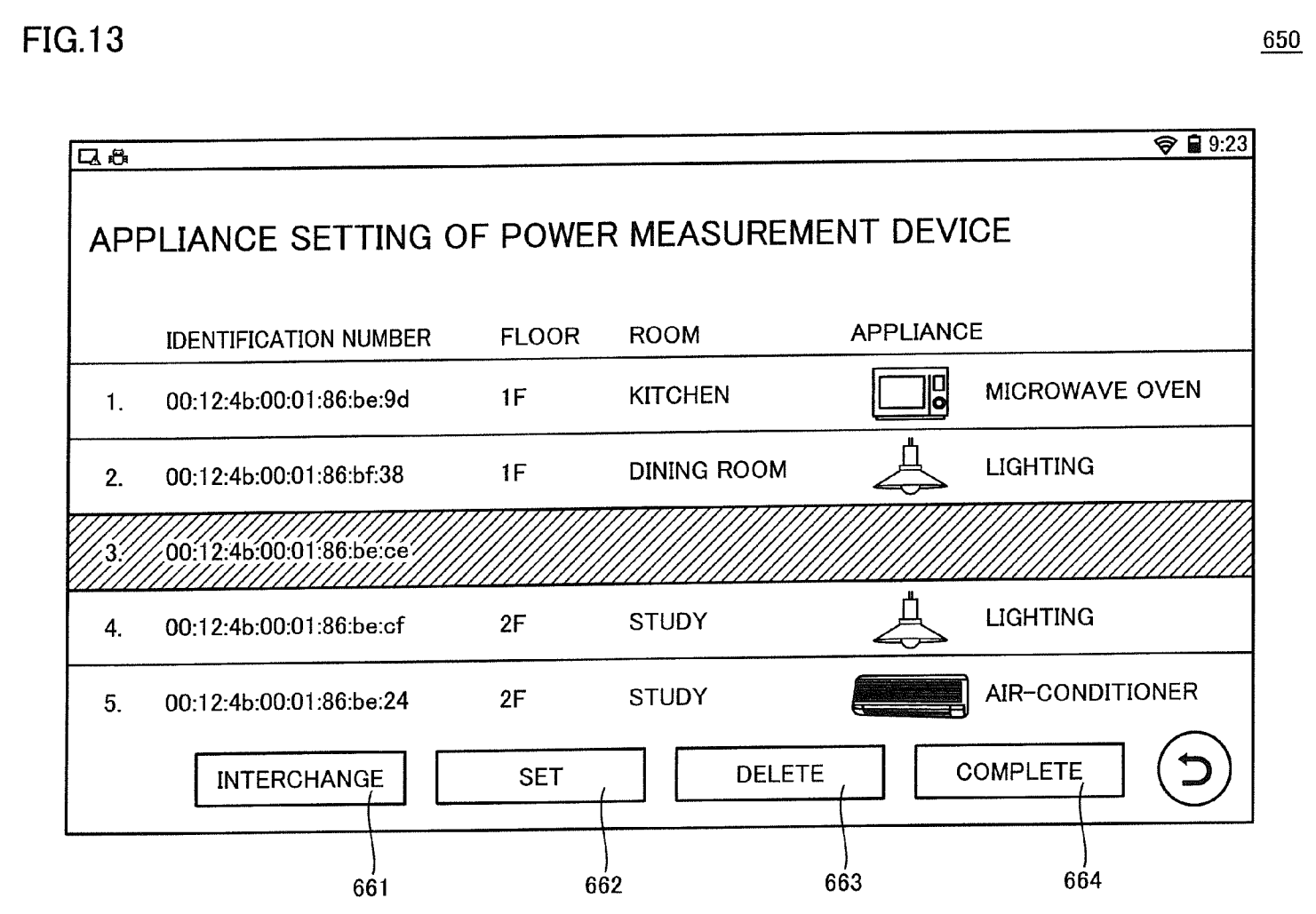

When the user requests start of change in setting to display device 100, a user interface screen 650 as shown in FIG. 13 is presented on touch panel 102. In user interface screen 650, meters 400 which can communicate data with management system 2 (displayed as "power measurement device" in FIG. 13) are displayed in a list and an identification number for each meter 400 (a MAC address in the example shown in FIG. 13) as well as associated electrical appliance 200 and a location of installation thereof are displayed.

User interface screen 650 includes an interchange button 661, a set button 662, a delete button 663, and a complete button 664.

When the user selects interchange button 661, information on associated electrical appliance 200 is interchanged between two selected meters 400 from among meters 400 displayed in a list (a user interface for selection is not illustrated), which is more convenient in a case of exchange between two meters 400 for electrical appliances 200 connected to each other.

When the user selects set button 662, a series of setting operations shown in FIGS. 14 to 17 can be performed. A setting operation in performing a setting operation for a third meter 400 associated with no electrical appliance 200 will be described in the example with reference to FIGS. 14 to 17 which will be described later.

When the user selects delete button 663, setting information of electrical appliance 200 associated with meter 400 selected in advance is deleted. When the user selects complete button 664, escape from a mode for changing setting is made and return to a menu screen is made.

Figure 14:
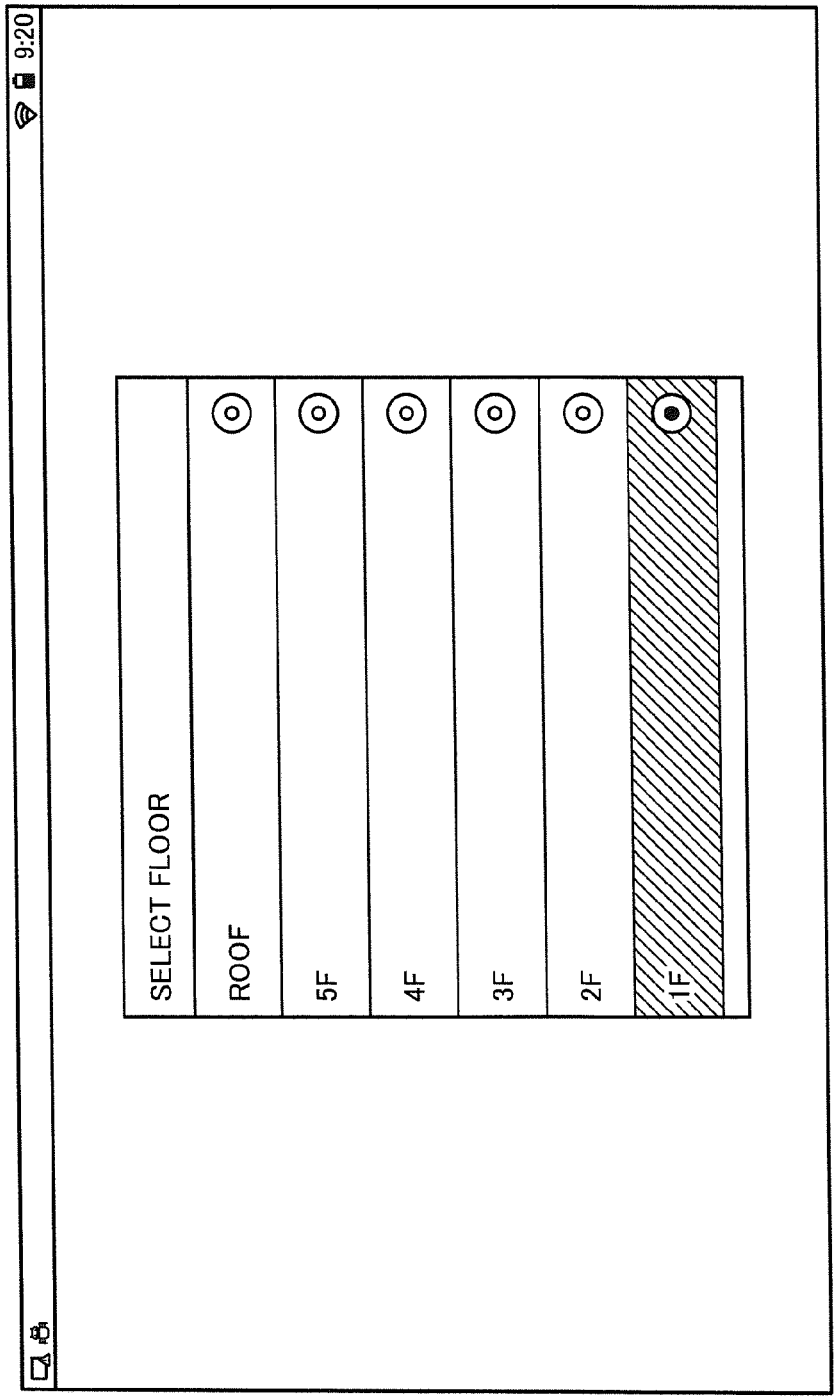
FIG. 14 is a diagram showing one example of a user interface screen involved with an operation for changing setting provided in the management system according to the first embodiment of the present invention.

When the user selects third meter 400 displayed in a list in user interface screen 650 shown in FIG. 13 and then selects set button 662, transition to a user interface screen 651 shown in FIG. 14 is made.

Figure 15:
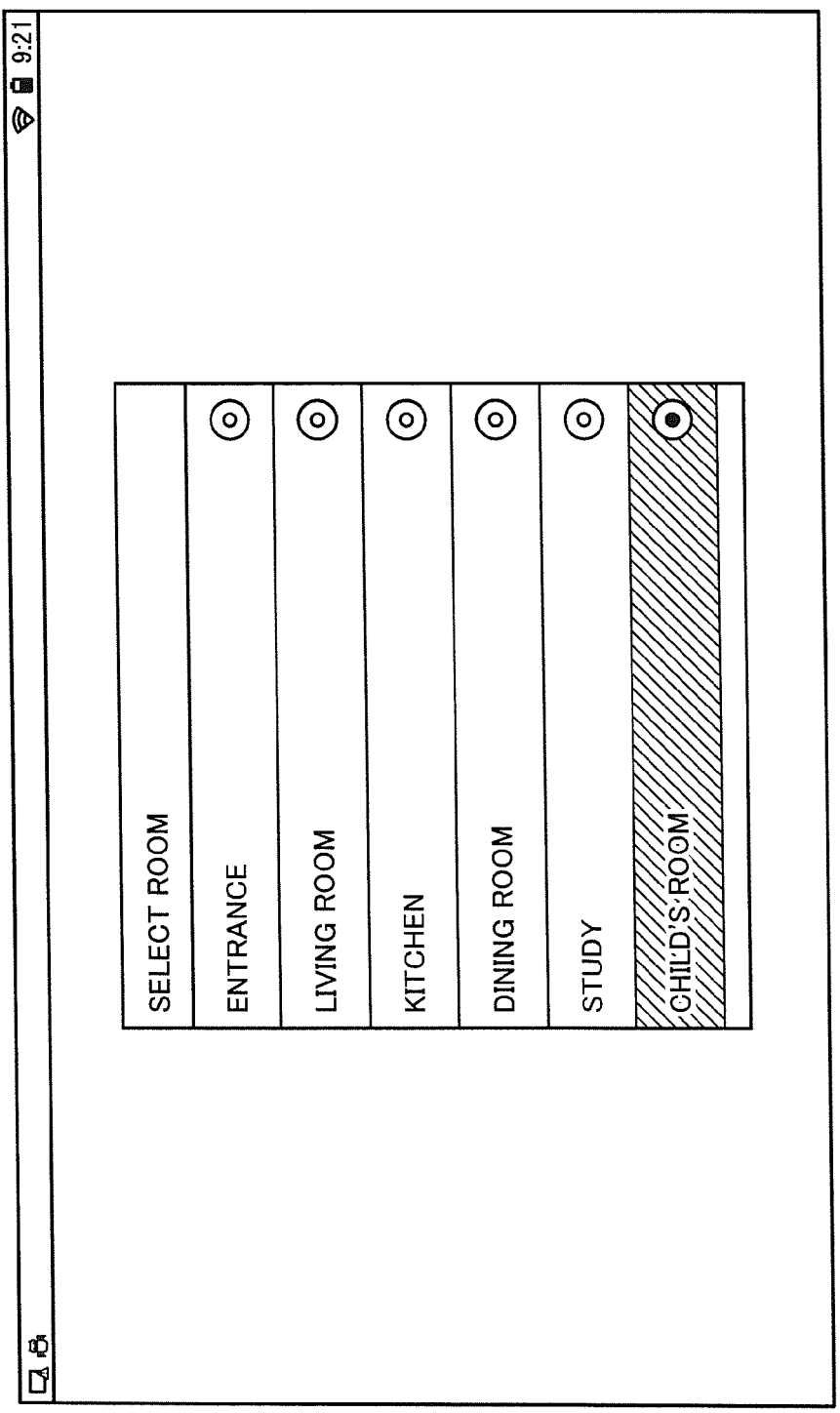
FIG. 15 is a diagram showing one example of a user interface screen involved with an operation for changing setting provided in the management system according to the first embodiment of the present invention.

In user interface screen 651, input of a floor where electrical appliance 200 connected to selected meter 400 is installed is requested. In the example shown in FIG. 14, a 1st floor (1F) to a 5th floor (5F) and a roof are displayed in a list as choices. For example, when the user selects the 1st floor (1F), transition to a user interface screen 652 shown in FIG. 15 is made.

Figure 16:
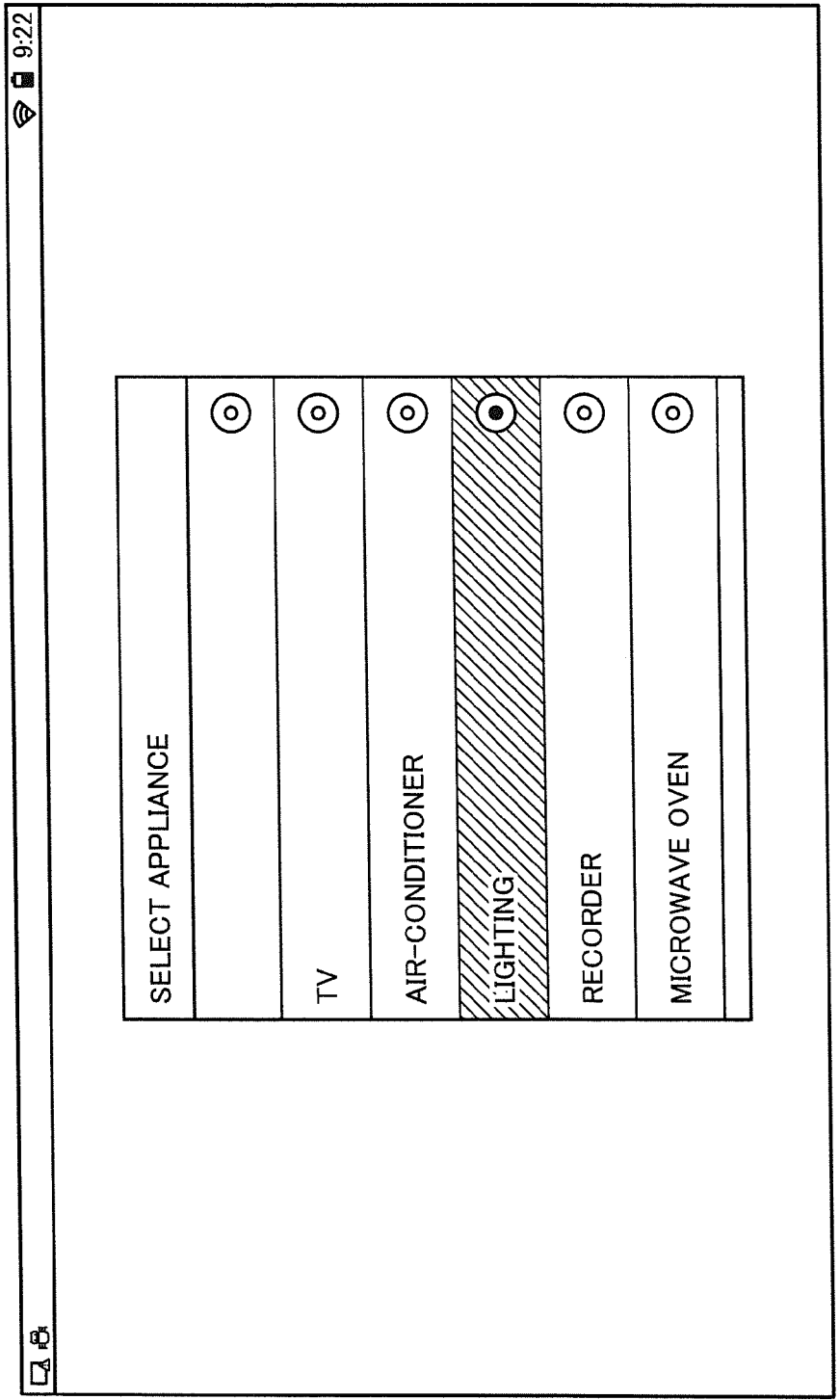
FIG. 16 is a diagram showing one example of a user interface screen involved with an operation for changing setting provided in the management system according to the first embodiment of the present invention.

In user interface screen 652, input of a room (area) where electrical appliance 200 connected to selected meter 400 is installed is requested. In the example shown in FIG. 15, an entrance, a living room, a kitchen, a dining room, a study, and a child's room are displayed in a list as choices. For example, when the user selects the child's room, transition to a user interface screen 653 shown in FIG. 16 is made.

In user interface screen 653, input of a type of electrical appliance 200 connected to selected meter 400 is requested. In the example shown in FIG. 16, a TV, an air-conditioner, lighting, a recorder, and a microwave oven are displayed in a list as choices. For example, when the user selects lighting, a series of operations for changing setting is completed. Then, as shown in FIG. 17, in a user interface screen 654, the fact that information on electrical appliance 200 input through the series of operations is associated with third meter 400 is presented.

As association between any meter 400 and electrical appliance 200 is changed in the operation for changing setting as above, display device 100 stores time when the change was made and contents of change in history information table 150.

Though an operation for changing setting is described here, similar processing is performed also for an operation for initial setting and registration for association between meter 400 and electrical appliance 200.

(e7: Correction Processing)

As described above, measurement information transmitted from meter 400 basically includes electric power consumed in connected electrical appliance 200 (instantaneous consumed power (unit: W or kW)). In such a case, consumed power is successively stored in measurement information table 350. By using such a measurement information table 350, information stored therein can be used as it is, so that graph 602 as shown in FIG. 11 can be displayed.

In a case of transmitting an accumulated amount of consumed power in electrical appliance 200 to which meter 400 is connected (an amount of consumed power (unit: Wh or kWh)) as measurement information, average consumed power in a unit time or an amount of consumed power in a unit time may be calculated from such measurement information and stored in measurement information table 350.

Meter 400 may be reset for some reason and an amount of consumed power accumulated prior thereto may be erased. In such a case, an error caused by erasure of the amount of consumed power should further be corrected. Such correction processing will be described below.

FIG. 18 is a diagram for illustrating processing for correcting measurement information in management system 2 according to the embodiment of the present invention. FIG. 18 (a) shows one example of change over time in value for measurement information in a case that meter 400 transmits a cumulative amount of consumed power as measurement information. As shown in FIG. 18 (a), an amount of consumed power in electrical appliance 200 during a certain time period corresponds to a difference between a cumulative amount of consumed power during that time period and a cumulative amount of consumed power during an immediately preceding time period. Therefore, a difference calculated for each time period is successively stored in measurement information table 350.

Here, it is assumed that meter 400 is reset for some reason at time t0. In this case, information held by meter 400 until immediately before is erased as a result of reset, and a cumulative amount of consumed power is cleared. Namely, as shown in FIG. 18 (a), immediately after reset, a cumulative amount of consumed power increases from zero.

In such a case, an amount of consumed power during a time period from time t1 to time t2 (hereinafter, denoted as a "time period t1-2") is a total of a difference in cumulative amount of consumed power from time t1 until immediately before reset (an amount of consumed power Ea) and a difference in cumulative amount of consumed power from immediately after reset until time t2 (an amount of consumed power Eb) (E(t1-2)=Ea+Eb). Namely, correction using an amount of consumed power Ea immediately before reset should be made. FIG. 18 (b) shows a result of such correction.

In FIG. 18 (b), an amount of consumed power during the time period from time t1 to time t2 (time period t1-2) is a difference between an amount of consumed power E(t2) at time t2 and an amount of consumed power E(t1) at time t1 (E(t1-2)=E(t2)−E(t1)).

Whether or not meter 400 has been reset may be indicated by meter 400, or determination as reset may be made when a cumulative amount of power consumption has changed beyond a prescribed threshold value before and after a time period.

(e8: Summary)

According to management system 2 in the present embodiment, information measured in meter 400 is stored as it is, so that processing for saving measurement information which is frequently produced can be simplified. Then, when a user requests output of electric power information, electric power information can be generated by extracting necessary measurement information based on history information managed in advance. By adopting such a feature, an entity storing measurement information and an entity generating/outputting/displaying electric power information can be provided independently of each other. Even incorrect association between meter 400 and electrical appliance 200 (appliance to be measured) can subsequently be addressed.

[F. First Variation of First Embodiment]

Though an example of use of history information table 150 holding history information including past association between meter 400 and electrical appliance 200 has been shown in the first embodiment described above, from a point of view of avoiding output of incorrect electric power information to a user, most recent association information and time of activation thereof may be held for each electrical appliance 200. Namely, management system 2 according to a first variation of the first embodiment stores as history information, information for identifying most recently associated meter 400 for each electrical appliance 200. By using such history information, measurement information of each electrical appliance 200 since at least immediately preceding change in connection can be output as electric power information.

FIG. 19 is a diagram showing one example of a data structure in a history information table 150A used in management system 2 according to the first variation of the first embodiment of the present invention. History information table 150A stores to which meter 400 each electrical appliance 200 (appliance to be measured) is connected and time and date of start of connection. Namely, history information table 150A includes association between electrical appliance 200 and meter 400 and activation time information indicating the time when association has been activated.

More specifically, history information table 150A includes column 1501 storing identification information of electrical appliance 200 (appliance to be measured), column 1502 showing time and date of start of connection of corresponding electrical appliance 200, and column 1504 storing identification information of meter 400 to which corresponding electrical appliance 200 is connected. Each time meter 400 to which each electrical appliance 200 (appliance to be measured) is connected is changed, contents in corresponding column 1502 are updated to the time of change of connection and contents in corresponding column 1504 are updated to identification information of connected meter 400. Namely, history information table 150A is different from history information table 150 shown in FIG. 9 (b) in absence of column 1503 and storage of only identification information of most recently connected meter 400.

History information table 150A shown in FIG. 19 is provided in correspondence with a "current" state shown in FIG. 10, and for appliance to be measured 2 which is connected to no meter 400, blank (null) is shown also in history information table 150A (column 1502 and column 1504).

As described in the first embodiment above, data storage device 300 chronologically stores measurement information for each meter 400 (measurement information table 350).

Referring to FIGS. 10 and 19, display device 100 can determine, with reference to history information table 150A, that appliance to be measured 1 is connected to meter A from 17:50 on Jul. 2, 2011 until the current time point. Therefore, display device 100 generates electric power information on appliance to be measured 1 by extracting measurement information from 17:50 on Jul. 2, 2011 until the current time point stored in association with meter A in measurement information table 350. Display device 100 generates electric power information on appliance to be measured 3 by extracting measurement information from 10:05 on Apr. 15, 2011 until the current time point stored in association with meter B in measurement information table 350. Since appliance to be measured 2 is not connected to meter 400, electric power information is not generated. Electric power information at the time when appliances to be measured 1 and 3 were connected to another meter 400 before currently connected meter 400 is not generated either.

In the present variation, since at least measurement information since at least immediately preceding change in connection of each electrical appliance 200 can be output as electric power information, correct electric power information can be generated and output while management of history information is simplified.

[G. Second Variation of First Embodiment]

Though a form of storage of each of measurement information table 350 and history information table 150A has been exemplified in the first variation of the first embodiment described above, these may be mounted as an integrated table.

FIG. 20 is a diagram showing one example of a data structure in a measurement information table 350B used in management system 2 according to a second variation of the first embodiment of the present invention. For the sake of convenience of illustration, measurement information table 350B shown in FIG. 20 is provided in correspondence with the "current" state shown in FIG. 10.

Measurement information table 350B includes a column 3509 storing identification information of electrical appliance 200 (appliance to be measured) most recently associated/having been associated with corresponding meter 400 and a column 3508 showing time and date of start of connection of corresponding electrical appliance 200 (time and date of activation of association). Measurement information table 350B further chronologically stores measurement information from meter 400 (a column 3502B).

Here, measurement information table 350B stores measurement information for each meter 400 with "time and date of start of connection" of corresponding electrical appliance 200 (appliance to be measured) being defined as the start timing. More specific description will be given with reference to FIG. 10. Measurement information corresponding to "meter A" in measurement information table 350B corresponds to a portion of measurement information measured by meter A as shown in FIG. 10 (a), from 17:50 on Jul. 2, 2011 at which a connected electrical appliance was changed from "appliance to be measured 2" to "appliance to be measured 1" until the current time point. Similarly, measurement information corresponding to "meter C" in measurement information table 350B corresponds to a portion of measurement information measured by meter C as shown in FIG. 10 (a), from 10:05 on Apr. 15, 2011 at which "appliance to be measured 3" was connected until the current time point.

Measurement information corresponding to "meter B" in measurement information table 350B corresponds to a portion of measurement information measured by meter B as shown in FIG. 10 (a), from 23:45 on Feb. 1, 2011 until 17:50 on Jul. 2, 2011 during which "appliance to be measured 1" was connected.

For example, display device 100 generates electric power information on appliance to be measured 1 with reference to measurement information table 350B, by extracting measurement information stored in association with meter B with 23:45 on Feb. 1, 2011 being defined as the start timing and extracting measurement information stored in association with meter A with 17:50 on Jul. 2, 2011 being defined as the start timing. Extracted measurement information does not overlap in principle on the temporal axis.

Similarly, display device 100 generates, with reference to measurement information table 350B, electric power information on appliance to be measured 3 by extracting measurement information stored in association with meter C with 10:05 on Apr. 15, 2011 being defined as the start timing.

In measurement information table 350B shown in FIG. 20, electric power information on appliance to be measured 2 is not generated.

In the present variation, since at least most recent measurement information on electrical appliance 200 connected to each meter 400 can be output as electric power information, correct electric power information can be generated and output while management of history information is simplified.

[H. Third Variation of First Embodiment]

Though management system 2 in which display device 100 and data storage device 300 are separate from each other has been described by way of example in the first embodiment and the first and second variations thereof described above, a management device in which these functions are integrated may be mounted. A home controller 100A as a typical example of a management device on which a function involved with management system 2 is mounted will be described below.

Figure 21:
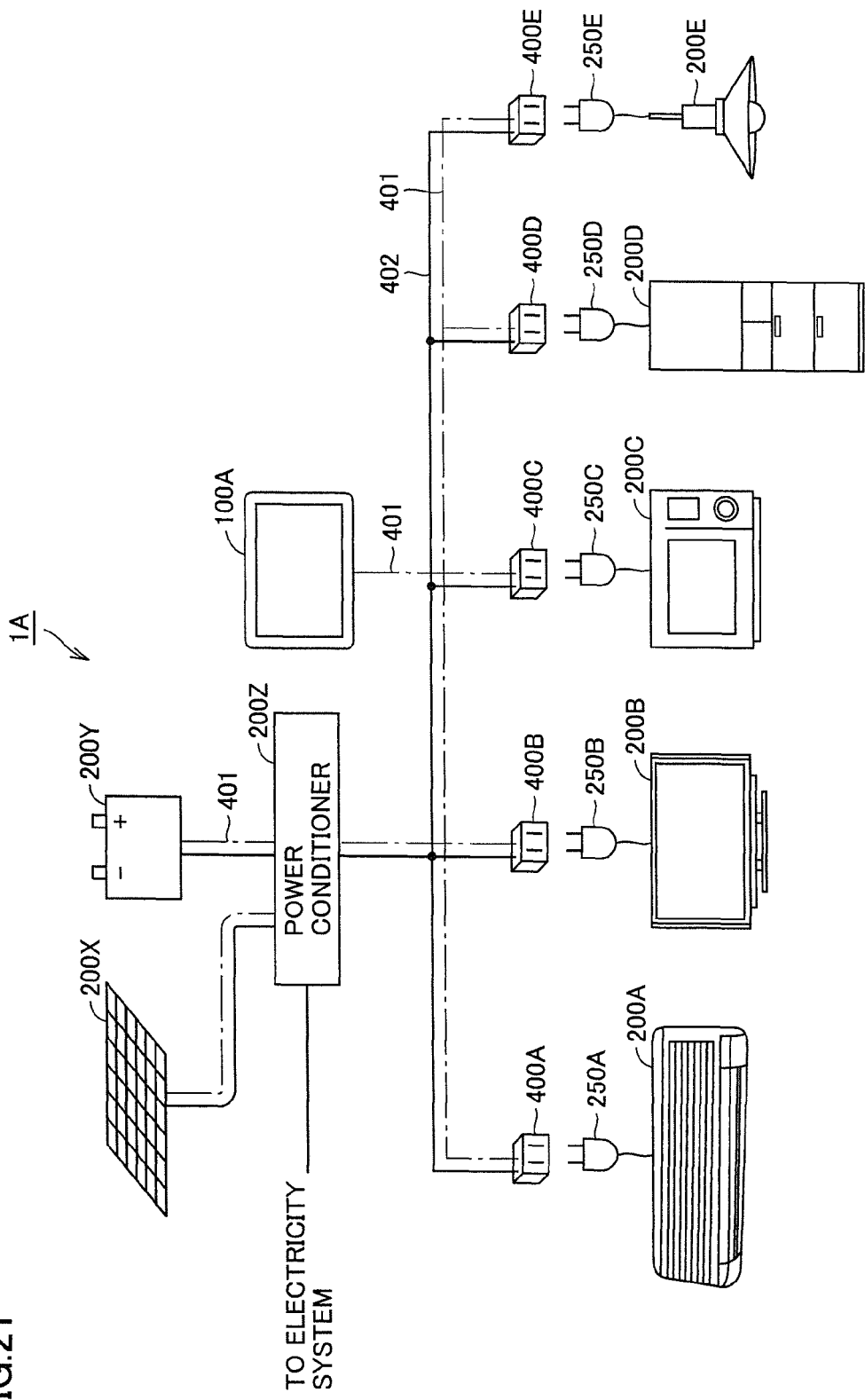
FIG. 21 is a schematic diagram showing an overall configuration of a power system including a home controller according to a third variation of the first embodiment of the present invention.
Figure 22:
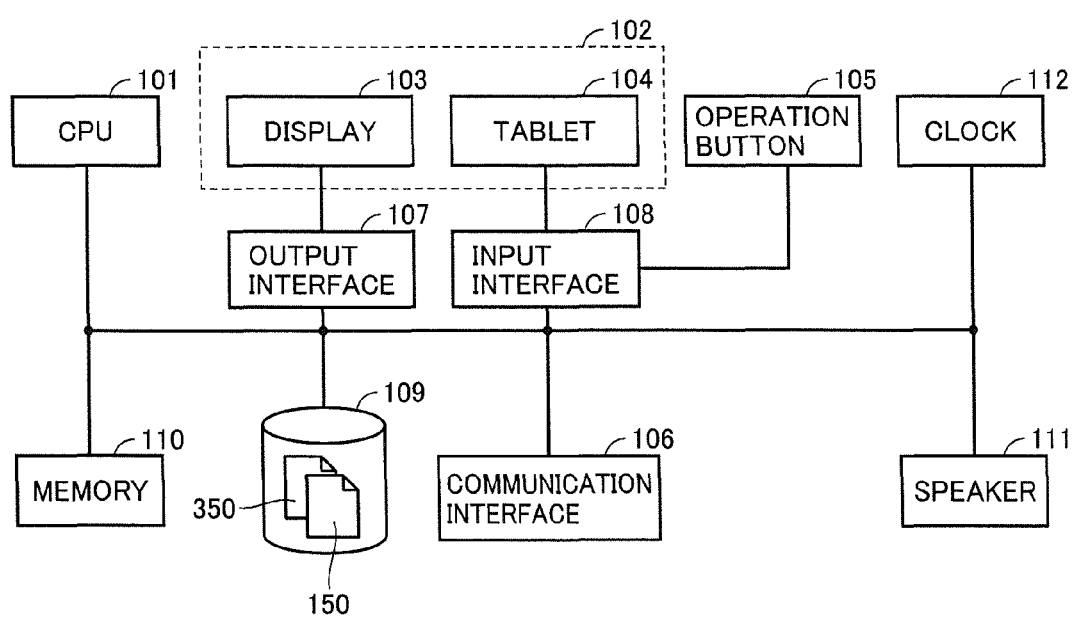
FIG. 22 is a schematic diagram showing a hardware configuration of the home controller according to the third variation of the first embodiment of the present invention.

FIG. 21 is a schematic diagram showing an overall configuration of a power system 1A including home controller 100A according to a third variation of the first embodiment of the present invention. FIG. 22 is a schematic diagram showing a hardware configuration of home controller 100A according to the third variation of the first embodiment of the present invention.

In power system 1A shown in FIG. 21, as compared with power system 1 shown in FIG. 1, home controller 100A is provided instead of display device 100 and data storage device 300. A hardware configuration of home controller 100A shown in FIG. 22 is similar to that of display device 100 shown in FIG. 2. Home controller 100A is different in saving and managing measurement information table 350 in addition to history information table 150 (or history information table 150A).

Home controller 100A provides in a single device, an overall function provided by any of management system 2 according to the first embodiment described above, management system 2 according to the first variation of the first embodiment, and management system 2 according to the second variation of the first embodiment. Information processing in this home controller 100A is implemented as CPU 101 (FIG. 22) executes a program in coordination with a peripheral hardware component. In general, such a program is installed in advance in memory 110.

Such a program may be provided as distributed as stored in any storage medium. Alternatively, such a program may be provided by downloading from a server device connected to the Internet. Namely, a stored program is read from a storage medium or a program is obtained through downloading from a server device, and then once stored in memory 110. Then, CPU 101 extracts the program stored in memory 110 in an executable format and then executes the program. As a storage medium storing such a program, a semiconductor storage medium such as a flash memory, a mask ROM, an EPROM, an EEPROM, or an IC card, an optical disc storage medium such as a CD-ROM or a DVD-ROM, a magneto-optical disc storage medium such as an MO or an MD, or a magnetic storage medium such as an FD, a magnetic tape, or a cassette tape can be employed.

Since other features have been described above, detailed description will not be repeated.

Since a smaller number of device configurations can be adopted in the present variation, a configuration can further be simplified and contribution to cost reduction can also be made. The present variation is similarly applicable also to an embodiment below.

[I. Second Embodiment]

(i1: Outlines)

Management system 2 according to a second embodiment of the present invention also manages electric power in connection with power consumption in at least one electrical appliance 200. Management system 2 has a function for obtaining measurement information on power consumption in electrical appliance 200 transmitted from meter 400 associated with each electrical appliance 200 and a function for chronologically storing measurement information obtained from each meter 400 in association with corresponding electrical appliance 200 (measurement information table 370) based on correspondence between meter 400 and electrical appliance 200 set in advance (correspondence table 360).

By way of example, in management system 2 shown in FIG. 1, data storage device 300 manages correspondence table 360 and measurement information table 370. Management system 2 further has a function for outputting electric power information on each electrical appliance 200 based on measurement information chronologically stored in association with electrical appliance 200 (measurement information table 370). This function for outputting electric power information may exist in any one or both of display device 100 and data storage device 300. Display device 100 having a function for outputting electric power information will be described below as a typical configuration.

Figure 23:
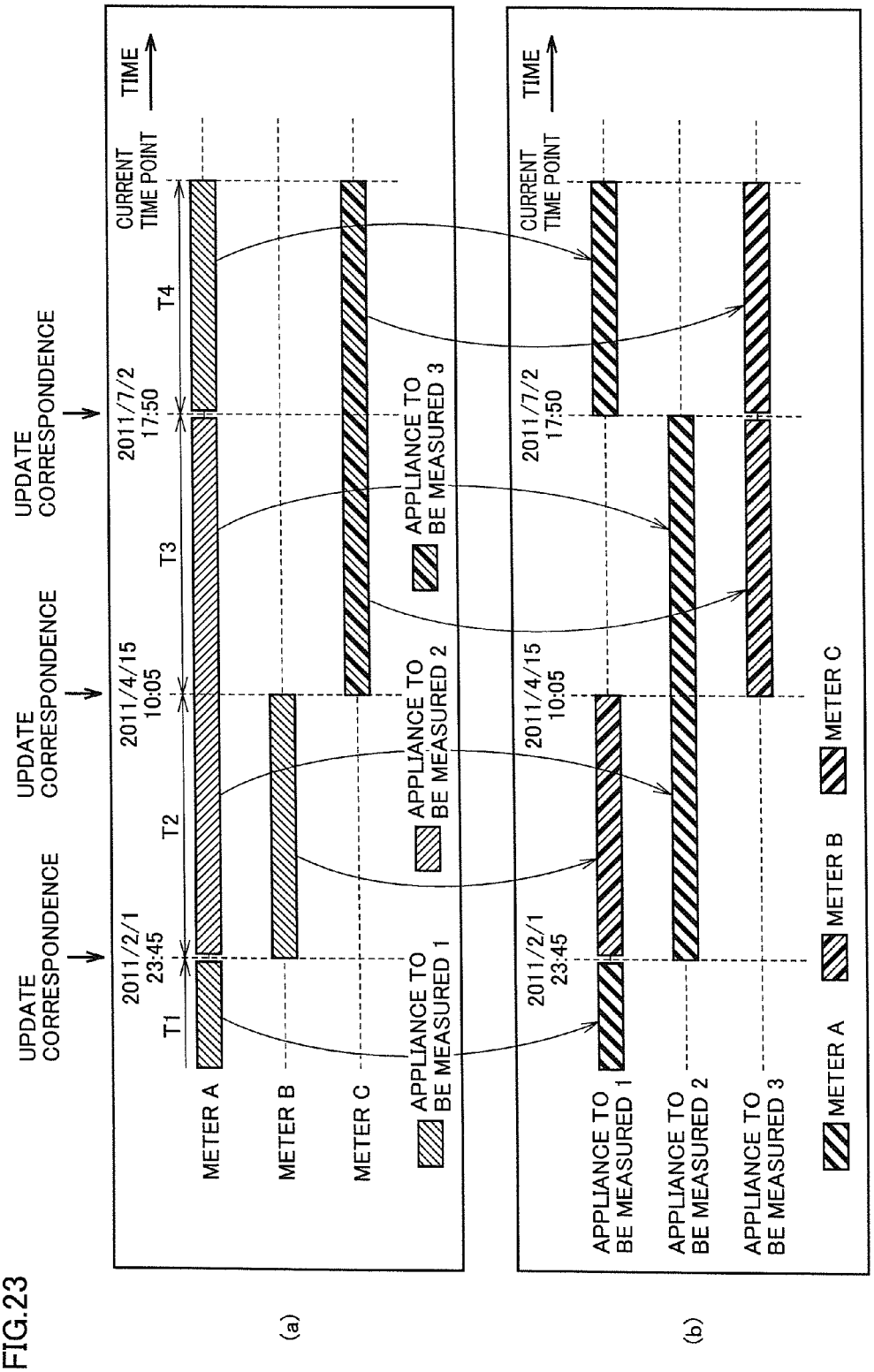
FIG. 23 is a diagram for illustrating processing for storing measurement information in the management system according to a second embodiment of the present invention.

FIG. 23 is a diagram for illustrating processing for storing measurement information in management system 2 according to the second embodiment of the present invention. FIG. 23 shows an example in which correspondence between electrical appliance 200 and meter 400 is changed as in FIG. 10 described in the first embodiment above.

In the present embodiment, measurement information transmitted from each meter 400 is stored in association with corresponding electrical appliance 200 based on correspondence between meter 400 and electrical appliance 200 (appliance to be measured) (correspondence table 360). For example, during a time period T1 until 23:45 on Feb. 1, 2011, appliance to be measured 1 is brought in correspondence with meter A, and data storage device 300 chronologically stores measurement information obtained from meter A in association with appliance to be measured 1.

After this time period T1, correspondence between electrical appliance 200 and meter 400 is updated. Namely, during a time period T2 subsequent to time period T1 (from 23:45 on Feb. 1, 2011 until 10:05 on Apr. 15, 2011), appliance to be measured 2 is brought in correspondence with meter A and appliance to be measured 1 is brought in correspondence with meter B. Therefore, data storage device 300 chronologically stores measurement information obtained from meter A in association with appliance to be measured 2 and chronologically stores measurement information obtained from meter B in association with appliance to be measured 1.

Similarly for time periods T3 and T4 as well, measurement information obtained from each meter 400 is chronologically stored in association with electrical appliance 200 (appliance to be measured).

Since measurement information is thus chronologically stored for each electrical appliance 200 (appliance to be measured), electric power information on each electrical appliance 200 (appliance to be measured) can readily be output.

(i2: Data Structure)

Figure 24:
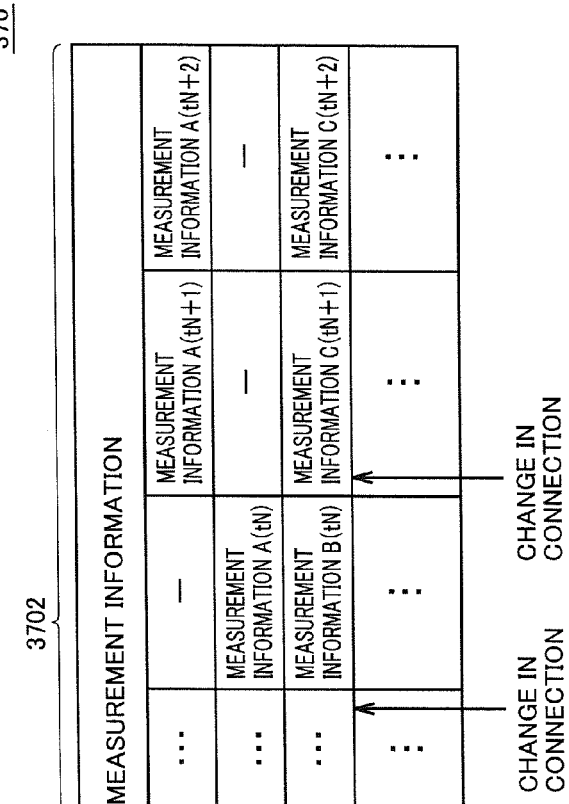
FIG. 24 is a diagram showing one example of a data structure in a table used in the management system according to the second embodiment of the present invention.

FIG. 24 is a diagram showing one example of a data structure in a table used in management system 2 according to the second embodiment of the present invention. FIG. 24 (*a*) shows one example of correspondence table 360 and FIG. 24 (*b*) shows one example of measurement information table 370. For the sake of convenience of illustration, correspondence table 360 shown in FIG. 24 (*a*) and measurement information table 370 shown in FIG. 24 (*b*) are shown in correspondence with the "current" state shown in FIG. 10.

Data storage device 300 determines correspondence between each meter 400 and electrical appliance 200 with reference to correspondence table 360. More specifically, correspondence table 360 includes a column 3601 storing identification information of electrical appliance 200 (appliance to be measured) and a column 3602 storing identification information of meter 400 to which corresponding electrical appliance 200 is connected. Each time meter 400 to which each electrical appliance 200 (appliance to be measured) is connected is changed, contents in corresponding column 1502 are updated to the time of change of connection and contents in corresponding column 1504 are updated to identification information of connected meter 400. Though FIG. 24 (*a*) shows an example where a name of meter 400 is stored in column 3602, a network address (a MAC address or an IP address) may be used.

Measurement information table 370 includes a column 3701 storing identification information of electrical appliance 200 (appliance to be measured) and a column 3702 successively storing measurement information on corresponding electrical appliance 200 (appliance to be measured).

In column 3702, measurement information transmitted from each meter 400 is successively stored in a row corresponding to connected electrical appliance 200. For example, measurement information A(t1) at time t1 measured by meter A is stored in a row corresponding to appliance to be measured 2 if meter A is connected to appliance to be measured 2 at time t1. Similarly, measurement information B(t1) at time t1 measured by meter B is stored in a row corresponding to appliance to be measured 1 if meter B is connected to appliance to be measured 1 at time t1. Subsequently, similar processing is repeated until connection is changed (correspondence table 360 is updated).

Thereafter, for example, when a connection target of appliance to be measured 1 is changed from meter B to meter A at time tN, subsequently, measurement information A(tN+1) measured by meter A is stored in the row corresponding to appliance to be measured 1.

Measurement information table 370 may store measurement information together with information for identifying meter 400 which conducts measurement. Namely, in the example shown in FIG. 24 (*b*), information indicating that measurement information A(t1) originates from "meter A" may be added.

Thus, management system 2 according to the present embodiment chronologically stores measurement information obtained from each meter 400 in association with corresponding electrical appliance 200 based on correspondence between meter 400 and electrical appliance 200 set in advance.

Since management system 2 according to the present embodiment should only be able to hold data stored in correspondence table 360 and measurement information table 370 described above, any data structure can be adopted without limited to the data structure shown in FIG. 24. Different devices may manage correspondence table 360 and measurement information table 370, respectively.

(i3: Measurement Information)

Since measurement information used in the second embodiment has been described in the first embodiment above, detailed description will not be repeated.

(i4: Processing for Outputting Electric Power Information)

Processing for outputting electric power information in the management system according to the present embodiment will now be described.

As described above, in the present embodiment, measurement information table 370 chronologically stores measurement information in association with electrical appliance 200. Therefore, measurement information on electrical appliance 200 selected by a user can readily be extracted.

Management system 2 according to the present embodiment typically presents display screen 600 shown in FIG. 11 described above. Namely, measurement information stored in each row of measurement information table 370 can be made use of as it is for generation of graph 602 in display screen 600 shown in FIG. 11 described above. Therefore, processing for outputting electric power information can be simplified.

Management system 2 according to the present embodiment is not limited to display screen 600 as shown in FIG. 11, and electric power information is output (presented) to the user in various forms based on measurement information stored in measurement information table 370. A form of output of electric power information my include not only display on a screen but also transmission of information via an electronic mail, disclosure of information on the Web, and print output on a paper medium with the use of a printer.

(i5: Processing Procedure)

A processing procedure in management system 2 according to the present embodiment will now be described.

Figure 25:
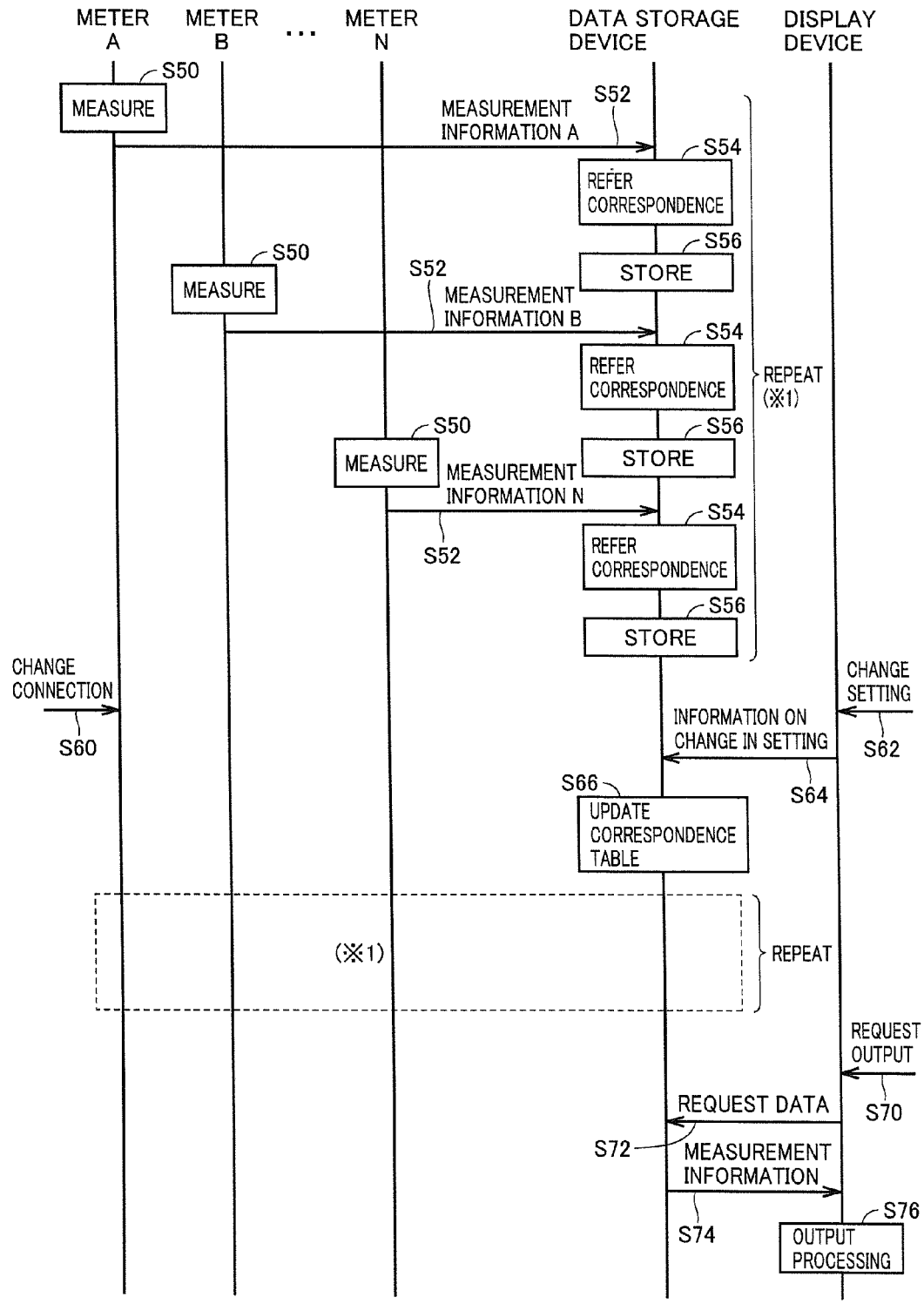
FIG. 25 is a sequence diagram showing a processing procedure in the management system according to the second embodiment of the present invention.

FIG. 25 is a sequence diagram showing a processing procedure in management system 2 according to the second embodiment of the present invention. Referring to FIG. 25, each of one or a plurality of meter(s) 400 measures information on power consumption in connected electrical appliance 200 (step S50), and transmits measurement information obtained through measurement to data storage device 300 (step S52). When data storage device 300 receives measurement information from any meter 400, it specifies electrical appliance 200 brought in correspondence with meter 400 which is a sender of measurement information, with reference to correspondence table 360 (step S54). Then, data storage device 300 chronologically stores measurement information received from each meter 400 in measurement information table 370 in association with a corresponding electrical appliance (step S56). Processing in steps S50 to S56 is repeated every prescribed period or every prescribed condition.

Thereafter, it is assumed that the user has changed electrical appliance 200 connected to any meter 400 (step S60). Here, the user performs an operation for changing setting involved with this change in display device 100 (step S62). Then, display device 100 transmits to data storage device 300, information on change in setting indicating contents of an operation for changing setting which is performed by the user. Data storage device 300 updates contents in correspondence table 360 based on this information on change in setting (step S74). After change in contents in correspondence table 360 as well, the processing in steps S50 to S56 is repeated every prescribed period or every prescribed condition.

Thereafter, it is assumed that the user has performed an operation for requesting output of electric power information in display device 100 (step S70). This requesting operation includes also selection of electrical appliance 200 (appliance to be measured) to which electric power information is to be output. In response to this requesting operation, display device 100 requests measurement information on selected electrical appliance 200 to data storage device 300 (step S72). Data storage device 300 extracts measurement information associated with designated electrical appliance 200 and transmits the measurement information to display device 100 (step S74). Display device 100 outputs electric power information on electrical appliance 200 selected by the user based on the measurement information received from data storage device 300 (step S76).

When the user has requested output of other electric power information to display device 100, requested electric power information is created and output through processing the same as described above.

(i6: Operation for Changing Setting)

Since an exemplary operation for changing setting performed at the time when electrical appliance 200 connected to meter 400 is changed has been described in the first embodiment above, detailed description will not be repeated.

(i7: Correction Processing)

The correction processing described in the first embodiment above can also similarly be applied to the second embodiment. Since contents in the correction processing have been described in the first embodiment above, detailed description will not be repeated.

[J. First Variation of Second Embodiment]

Though the example in which correspondence table 360 showing correspondence between meter 400 and electrical appliance 200 set in advance and measurement information table 370 chronologically storing measurement information obtained from each meter 400 in association with corresponding electrical appliance 200 are separately configured has been shown in the second embodiment described above, identification information of electrical appliance 200 (appliance to be measured) serves as a key in any table and hence both of them may be configured as the same table. Namely, in management system 2 according to a first variation of the second embodiment, correspondence between meter 400 and electrical appliance 200 is added to a table storing measurement information obtained from each meter 400.

FIG. 26 is a diagram showing one example of a data structure in a measurement information table 370A used in management system 2 according to the first variation of the second embodiment of the present invention. Referring to FIG. 26, measurement information table 370A includes column 3701 storing identification information of electrical appliance 200 (appliance to be measured), column 3702 showing time and date of start of connection of corresponding electrical appliance 200 (appliance to be measured), a column 3705 storing identification information of meter 400 to which corresponding electrical appliance 200 (appliance to be measured) is connected, and column 3702 successively storing measurement information on corresponding electrical appliance 200 (appliance to be measured).

Each time meter 400 to which each electrical appliance 200 (appliance to be measured) is connected is changed, contents in corresponding columns 3074 and 3075 are updated. Namely, contents in column 3074 are updated to the time of change of connection and contents in column 3075 are updated to identification information indicating meter 400 after connection has been changed.

When data storage device 300 receives measurement information from any meter 400, it specifies, with reference to measurement information table 370A, electrical appliance 200 brought in correspondence with meter 400 which is a sender of the measurement information (a row in measurement information table 370A) and successively stores received measurement information in a specified row.

In the present variation, the number of times of access to the table by data storage device 300 can be decreased and management of correspondence and measurement information can be facilitated.

Contents in "time and date of start of connection" stored in column 3074 in measurement information table 370A are not essential. This "time and date of start of connection" can be displayed, however, as superimposed on screen 600 displaying electric power information shown in FIG. 11, so that the user can know since when current correspondence between meter 400 and electrical appliance 200 has been active.

[K. Second Variation of Second Embodiment]

Though management system 2 in which display device 100 and data storage device 300 are separate from each other has been described by way of example in the second embodiment and the first variation thereof described above, such a management device that these functions are integrated may be mounted. A management device on which a function involved with such a management system 2 is mounted is typically mounted as a home controller. Since an overall configuration of the power system including such a home controller is the same as that of power system 1A shown in FIG. 21 above, detailed description will not be repeated. Since a hardware configuration of the home controller is the same as that of home controller 100A shown in FIG. 22 above, detailed description will not be repeated.

The home controller provides in a single device, an overall function provided by management system 2 according to the second embodiment described above or management system 2 according to the first variation of the second embodiment. Information processing in this home controller is implemented as CPU 101 (FIG. 22) executes a program in coordination with a peripheral hardware component. In general, such a program is installed in advance in memory 110. Since a form of providing such a program has been described in the first embodiment above, detailed description will not be repeated.

Since a smaller number of device configurations can be adopted in the present variation, a configuration can further be simplified and contribution to cost reduction can also be made.

As described above, according to the present embodiment, even though electrical appliance 200 connected to the same meter 400 is changed by replacement purchase/additional purchase of electrical appliance 200 or redecoration of a room, a series of pieces of measurement information from the past of each electrical appliance 200 can readily be managed. Electric power information can more readily be generated and output by using such measurement information.

[L: Third Embodiment]

In the management system, the home controller desirably presents information on a state of power consumption in a plurality of electrical appliances which is useful for a user. In the present third embodiment, presentation of such information in the home controller will be described.

<Household Electrical Appliance Monitor Screen>

Figure 27:
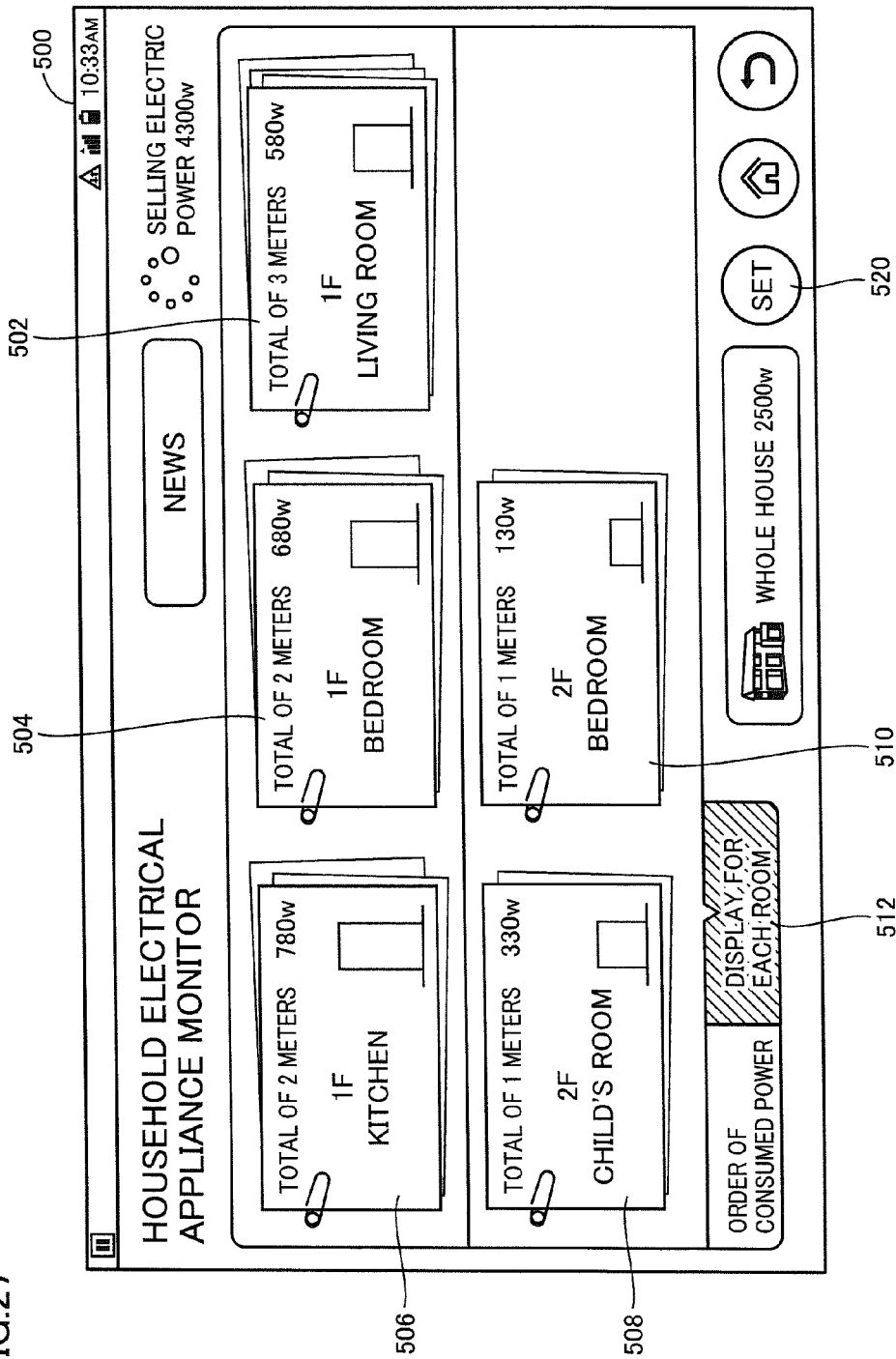
FIG. 27 is a diagram illustrating a household electrical appliance monitor screen displayed on a display 103 of a display device 100 according to a third embodiment of the present invention.

FIG. 27 is a diagram illustrating a household electrical appliance monitor screen displayed on display 103 of display device 100 according to the third embodiment of the present invention.

Referring to FIG. 27, here, grouping of a plurality of electrical appliances (in the present example, 9 electrical appliances) in a plurality of layers is carried out in a household electrical appliance monitor screen 500, and for each group categorized through grouping, a screen in which object display of information on power consumption in an electrical appliance belonging to a group is provided is shown. Information on power consumption in an electrical appliance is based on measurement information measured in corresponding meter 400.

Specifically, a plurality of power management objects are displayed, and 5 selectably provided power management objects 502 to 510 are provided by way of example. A set button 520 for providing a user interface screen for changing setting described above is provided. As described above, set button 520 can be selected so as to set correspondence between meter 400 and electrical appliance 200 (appliance to be measured) (correspondence table 360) described above in accordance with a series of operations in FIGS. 13 to 17. As association between any meter 400 and electrical appliance 200 is registered through the operation, contents of registration (such as attribute information) are stored in correspondence table 360 in hard disk 109 of display device 100. Namely, with the operation for setting and registration, a plurality of pieces of attribute information of electrical appliance 200 are registered in association. For example, for electrical appliance 200 (lighting), the 1st floor is registered as first attribute information (a floor of installation) and a child's room is registered as second attribute information (a room (an area) of installation). Then, grouping of a plurality of electrical appliances according to the present third embodiment is carried out based on the attribute information.

In each power management object, by way of example, information on power consumption in an electrical appliance belonging to each categorized group is shown and a value for total consumed power in a group of electrical appliances is shown. Such indication is not limited to a value for consumed power. For example, a value for a total amount of consumed power in the group of electrical appliances (Wh or KWh) may be displayed, both of them may be displayed, or any information on power consumption may be acceptable.

Though power management objects are disposed in the order of a value of an amount of consumed power in the present example, limitation to that scheme is not particularly intended. Priority may be allocated to attribute information which will be described later and power management objects may be disposed in the order of allocated priority.

Regarding grouping, household electrical appliance monitor screen 500 shows grouping in accordance with floors in premises (first grouping).

Each group grouped in accordance with the floor is further grouped for each room (second grouping).

Then, consumed power in an electrical appliance belonging to each group categorized for each room is displayed. In processing, a plurality of pieces of attribute information are registered for each electrical appliance in correspondence table 360, and grouping in a plurality of layers is carried out based on attribute information. Here, for each electrical appliance, a plurality of pieces of attribute information of "floor" and "room" of installation are registered.

In household electrical appliance monitor screen 500, power management objects 502 to 506 provided in an upper region correspond to a 1F group and they are further categorized into three groups for each room.

In power management object 502, attribute information "floor" and "room" is displayed. The floor in the premises is 1F and the room corresponds to the kitchen. The number of corresponding meters is shown as the number of electrical appliances belonging to the group, and in the present example, 3 is shown. Based on measurement information from the meter, consumed power 580 w which is the total of 3 meters is displayed as information on power consumption. A bar graph is displayed together with a numeric value, so that a value for consumed power can intuitively be known and comparison with another power management object can also readily be made.

As a form of display of power management object 502, card objects in such a state that a plurality of cards (4 cards) are layered and a clip-shaped object appears to hold them together are displayed. Specifically, of the plurality of (four) cards, a card in the forefront is an appliance summarization card and cards displayed in such a form as arranged as layered behind the former are appliance cards corresponding to meters. The number of appliance cards corresponds to the number of meters, that is, three electrical appliances, and three cards in accordance with the number of three meters are displayed in such a form as arranged as layered behind the forefront card. Cards are displayed in such a form that their positions are slightly displaced for viewing of each card. With such display, for how many appliances information on power consumption is provided can intuitively and readily be known intuitively from the number of cards. If there are many meters, the number of appliance cards may be restricted, and for example, the number of cards may be set to three at the maximum.

The appliance summarization card summarizing appliance cards, which looks like being layered on the appliance cards, is provided, information on power consumption is displayed within the card, and appliance cards appear to be held together by a clip-shaped object, so that the fact that the information is on power consumption summarized as a result of grouping can also intuitively be known. This is also the case with a form of display of other power management objects.

In power management object 504, attribute information "floor" and "room" is displayed. The floor in the premises is 1F and the room corresponds to a bedroom. The number of electrical appliances belonging to the group corresponds to the number of meters of two. Then, based on measurement information from the meter, consumed power 680 w which is the total of two meters is displayed as information on power consumption.

In power management object 506, attribute information "floor" and "room" is displayed. The floor in the premises is 1F and the room corresponds to the kitchen. The number of electrical appliances belonging to the group corresponds to the number of meters of two. Then, based on measurement information from the meter, consumed power 780 w which is the total of two meters is displayed as information on power consumption.

Power management objects 508 and 510 provided in a lower region of household electrical appliance monitor screen 500 correspond to a 2F group and they are categorized into two groups for each room.

In power management object 508, attribute information "floor" and "room" is displayed. The floor in the premises is 2F and the room corresponds to a child's room. The number of electrical appliances belonging to the group corresponds to the number of meters of one. Then, based on measurement information from the meter, consumed power 330 w which is the total of one meter is displayed as information on power consumption.

In power management object 510, attribute information "floor" and "room" is displayed. The floor in the premises is 2F and the room corresponds to a bedroom. The number of electrical appliances belonging to the group corresponds to the number of meters of one. Then, based on measurement information from the meter, consumed power 130 w which is the total of one meter is displayed as information on power consumption.

The power management object in household electrical appliance monitor screen 500 corresponds to a selectably provided button, and by selecting a power management object, a detailed group detail screen (FIG. 28) for a group of power management objects is displayed.

As shown in household electrical appliance monitor screen 500 in the present embodiment, grouping in a plurality of layers is carried out for display based on a plurality of pieces of attribute information. Thus, even when there are many electrical appliances, a state of power consumption in a group of electrical appliances categorized into each group can readily be known. By making setting with an electrical appliance and attribute information being associated with each other, regardless of a condition of installation, categorization in accordance with the attribute information can be made. Therefore, by carrying out grouping by making use of attribute information which can easily be known with attention being paid to a group such as "floor" and "group", information on a state of power consumption useful for a user can be presented.

A boundary for distinction between the upper region and the lower region is provided for having a categorized state more explicitly known is shown. As in the present example, however, in a case that a floor is displayed in a power management object, such grouping as categorization into upstairs and downstairs is explicit from indication of the floor without particularly providing a boundary, and hence no boundary can be provided.

Regarding a display format, as priority of attribute information "floor", priority on a lower floor in the order of 1F, 2F, 3F, 4F, . . . is set in advance and display is provided in accordance with the priority. The priority can be reversed. An upper layer may be prioritized, and for example, a lower region is displayed for 1F and an upper region is displayed for 2F, such that information on power consumption can more readily and intuitively be understood in relation to an actual layered structure of premises.

<Group Detail Screen>

Figure 28:
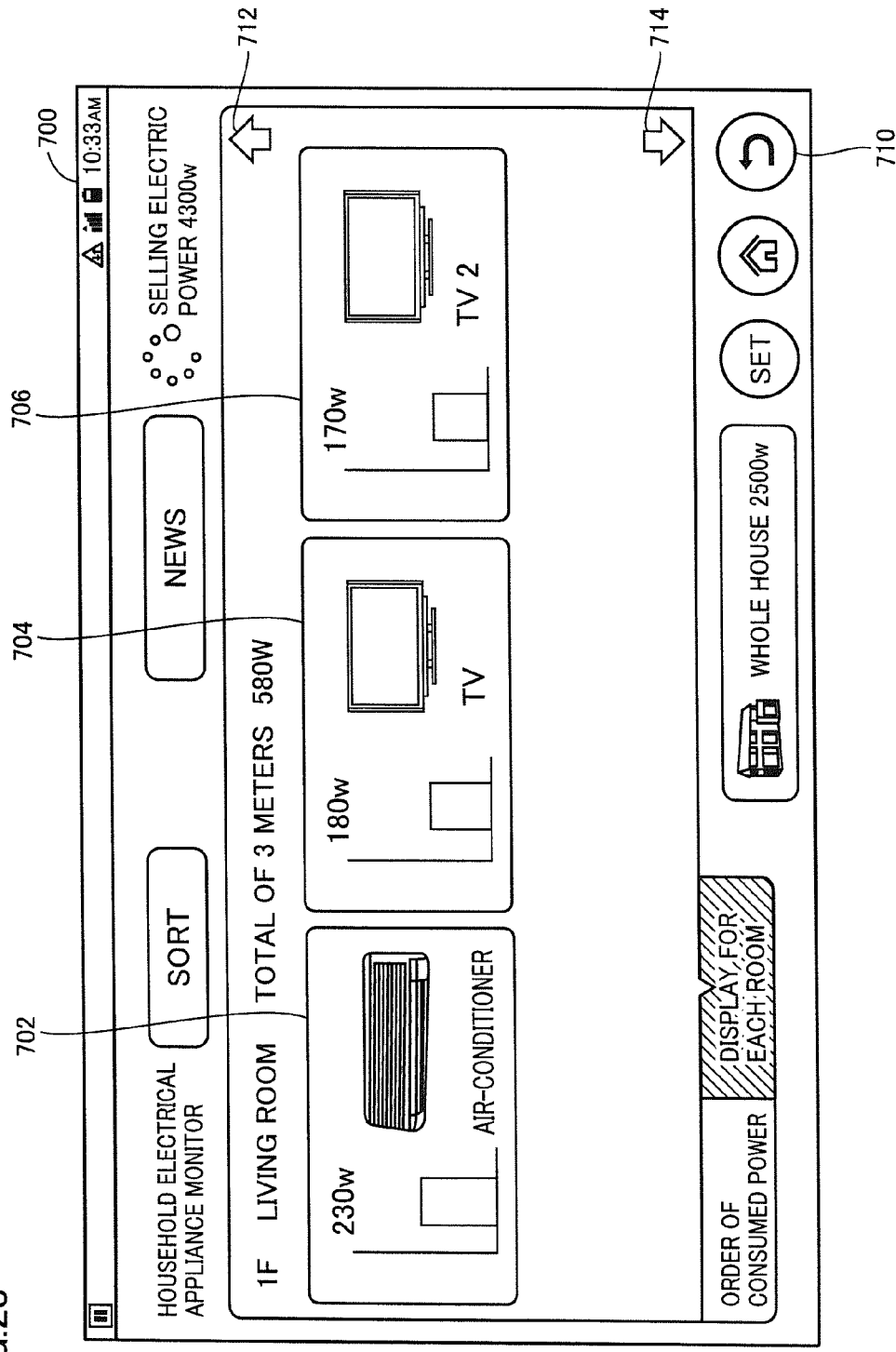
FIG. 28 is a diagram illustrating a group detail screen displayed on display 103 of display device 100 according to the third embodiment of the present invention.

FIG. 28 is a diagram illustrating a group detail screen displayed on display 103 of display device 100 according to the third embodiment of the present invention.

Referring to FIG. 28, here, one example of a group detail screen 700 according to the third embodiment of the present invention is shown and a case that power management object 502 is selected in household electrical appliance monitor screen 500 is shown.

In group detail screen 700, here, electrical appliance objects 702 to 706 are provided.

Specifically, information on power consumption in each in a group of electrical appliances belonging to a group corresponding to power management object 502 (attribute information "1F" "living room") is expanded and information on power consumption for each electrical appliance, that is, consumed power, is shown. Such indication is not limited to a value for consumed power. For example, a value for an amount of consumed power in an electrical appliance (Wh or KWh) may be displayed, indication together with consumed power may be provided, or any information on power consumption may be acceptable.

In the screen, in the present example, electrical appliance object 702 corresponds to an electrical appliance "air-conditioner" and consumed power 230 w is displayed as information on power consumption based on measurement information from a meter.

Electrical appliance object 704 corresponds to an electrical appliance "TV" and consumed power 180 w is displayed as information on power consumption.

Electrical appliance object 706 corresponds to an electrical appliance "TV 2" and consumed power 170 w is displayed as information on power consumption.

In accordance with the information, information on power consumption in each electrical appliance belonging to the group, that is, information on consumed power, can readily be checked on the group detail screen, and power saving can be encouraged.

Though display is in accordance with the order of consumed power in the group detail screen, the order is not limited to that scheme. For example, priority of electrical appliances may be provided in advance and the order may be in accordance with the priority.

In group detail screen 700, a direction object 712 for selecting an upward direction and a direction object 714 for selecting a downward direction are provided. By selecting and operating direction object 712, 714, information on power consumption in each electrical appliance belonging to another group can be displayed.

Specifically, another group categorized under the same group through first grouping is also expanded and a group detail screen is displayed. In the present example, as another group, a group detail screen of a group corresponding to attribute information ("1F", "kitchen") and a group detail screen of a group corresponding to attribute information ("1F", "bedroom") categorized under the group of floor "1F" are displayed, which will be described later.

A "back" button 710 is provided, and by selecting the button, immediately preceding household electrical appliance monitor screen 500 in FIG. 27 is displayed.

Though provision of direction objects 712 and 714 for allowing scrolling for display of another group detail screen is described in the present example, limitation to the scheme is not particularly intended. Scroll display of another group detail screen may be provided by providing a scroll bar and selecting and operating the scroll bar.

<Display Processing in Display Device 100>

Figure 29:
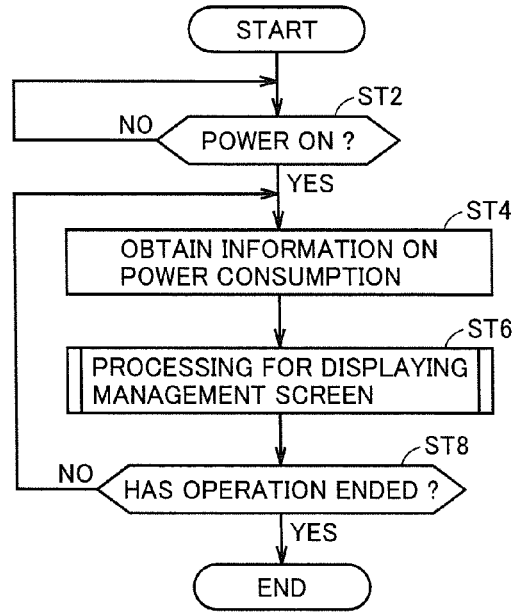
FIG. 29 is a main flowchart illustrating processing for display on display device 100 according to the third embodiment of the present invention.

FIG. 29 is a main flowchart illustrating processing for display on display device 100 according to the third embodiment of the present invention. The processing is mainly performed by CPU 101 in cooperation with display 103 based on data stored in memory 110 and hard disk 109. This is also the case with a flow below.

Referring to FIG. 29, initially, whether or not power has turned on is determined (step STT2). Specifically, whether or not a not-shown power button provided in display device 100 has been selected and whether or not power has been turned on is determined.

When it is determined in step ST2 that power has been turned on (YEST in step ST2), then, information on power consumption is obtained (step ST4).

Then, processing for displaying a management screen is performed (step ST6). Details of the processing for displaying a management screen will be described later.

Then, whether or not an operation has ended is determined (step ST8). When it is determined in step ST8 that the operation has ended (YEST in step ST8), the process ends (end).

When it is determined in step ST8 that the operation has not ended, the process returns to step ST4 and the processing above is repeated. For example, when a not-shown power button is selected again by way of example of end of operation, the process ends.

Though a case that various types of processing are performed by automatically starting up and executing a program stored in memory 110 when a power button is pressed is described in the present example, limitation thereto is not intended, and various types of processing can be performed by starting up a program in response to an instruction from a user. This is also the case with processing below.

Figure 30:
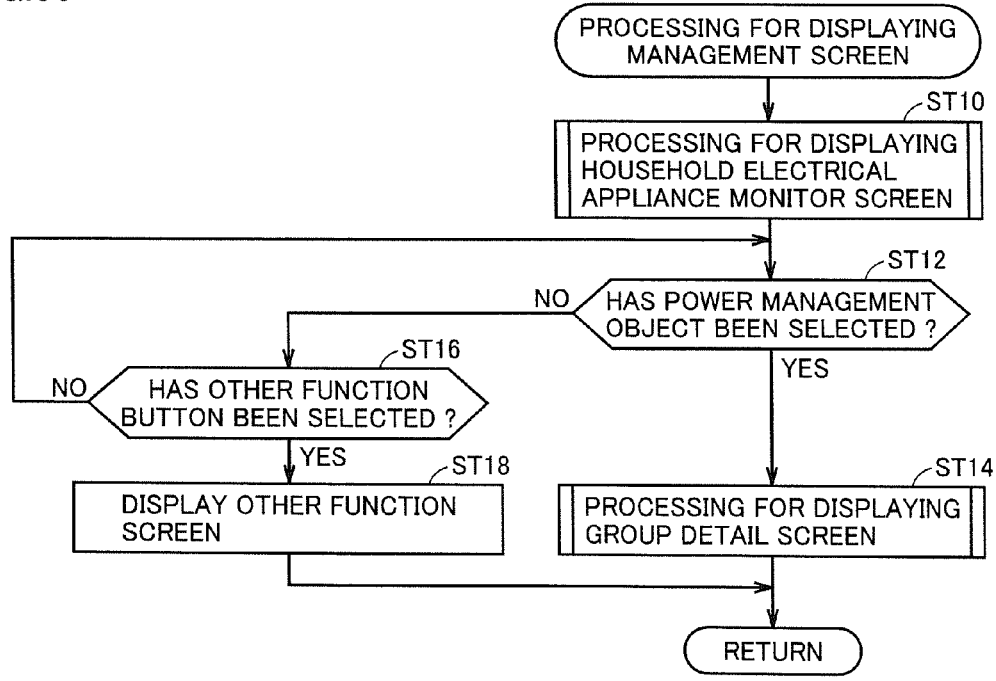
FIG. 30 is a flowchart illustrating processing for displaying a management screen according to the third embodiment of the present invention.

FIG. 30 is a flowchart illustrating the processing for displaying a management screen according to the third embodiment of the present invention.

Referring to FIG. 30, initially, a household electrical appliance monitor screen is displayed (step ST10). Specifically, the household electrical appliance monitor screen described with reference to FIG. 27 is displayed based on measurement information from a meter. Details of the display processing will be described later.

Then, whether or not a power management object has been selected is determined (step ST12). Specifically, whether or not a power management object has been selected in the household electrical appliance monitor screen described with reference to FIG. 27 is determined.

When it is determined in step ST12 that a power management object has been selected (YEST in step ST12), processing for displaying a group detail screen corresponding to the power management object is performed (step ST14). Specifically, the group detail screen described with reference to FIG. 28 is displayed. Details of the processing for displaying the group detail screen will be described later.

Then, the process ends (return).

When it is determined that no power management object has been selected (NO in step ST12), whether or not other function button has been selected is determined (step ST16).

When it is determined in step ST16 that other function button has been selected (YEST in step ST16), a screen corresponding to other function button is displayed (step ST18).

Then, the process ends (return).

When it is determined that no other function button has been selected (NO in step ST16), the process returns to step ST12.

Figure 31:
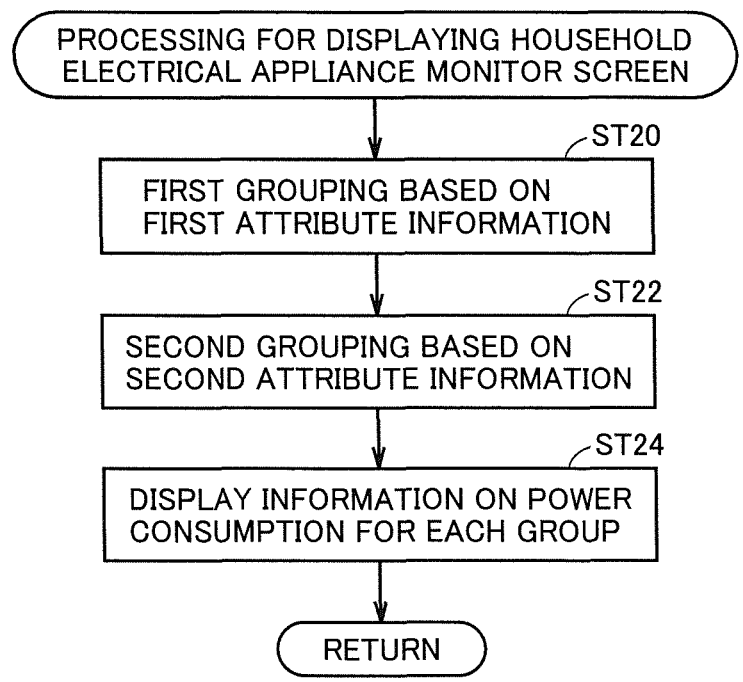
FIG. 31 is a flowchart illustrating processing for displaying a household electrical appliance monitor screen according to the third embodiment of the present invention.

FIG. 31 is a flowchart illustrating the processing for displaying a household electrical appliance monitor screen according to the third embodiment of the present invention.

Referring to FIG. 31, initially, first grouping is carried out based on first attribute information (step ST20). In the example above, first grouping is carried out based on attribute information "floor".

Then, second grouping is carried out based on second attribute information (step ST22). In the example above, second grouping is carried out based on attribute information "room".

Then, information on power consumption is displayed for each group categorized through grouping in a plurality of layers (step ST24).

Then, the process ends (return).

Figure 32:
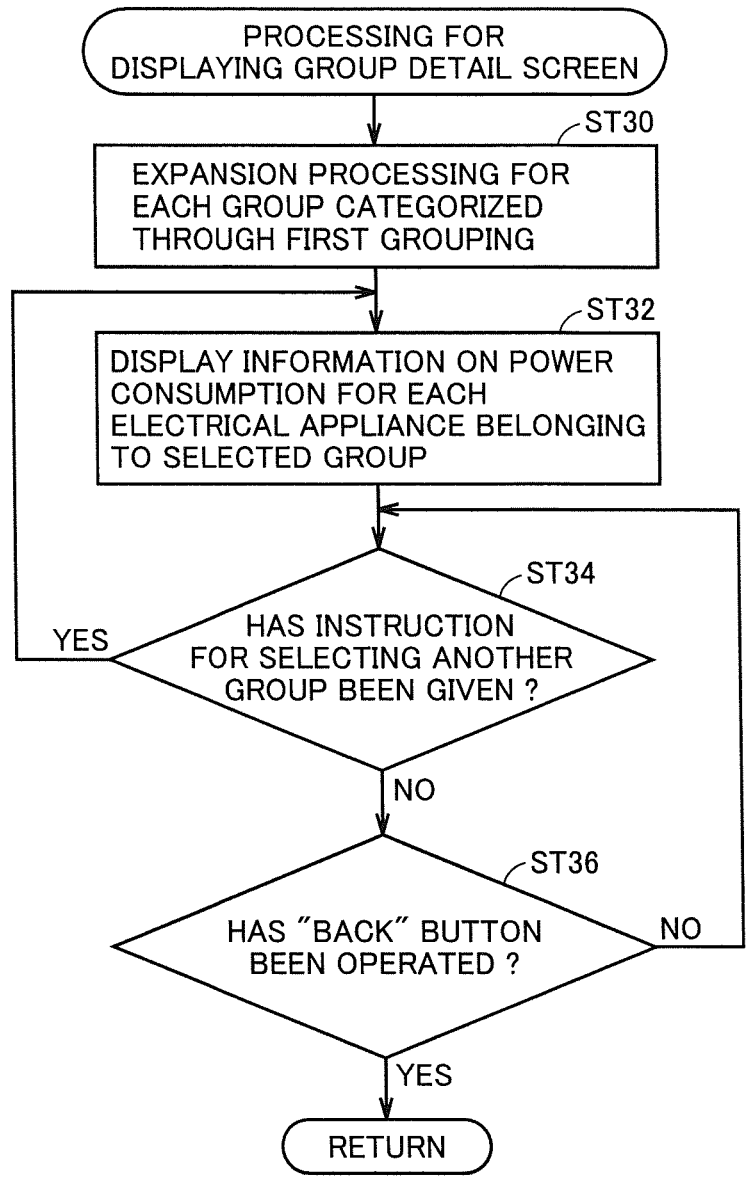
FIG. 32 is a flowchart illustrating processing for displaying a group detail screen according to the third embodiment of the present invention.

FIG. 32 is a flowchart illustrating the processing for displaying a group detail screen according to the third embodiment of the present invention.

Referring to FIG. 32, expansion processing for each group categorized through first grouping is performed (step ST30).

Then, information on power consumption is displayed for each electrical appliance belonging to the selected group (step ST32).

Then, whether or not an instruction for selecting another group has been given is determined (step ST34). Specifically, whether or not an operation instruction for selecting direction object 612, 614 in group detail screen 700 in FIG. 28 has been given is determined.

When it is determined in step ST34 that an instruction for selecting another group has been given (YEST in step ST34), the process returns to step ST34, and information on power consumption for each electrical appliance belonging to the selected group is displayed.

When no instruction for selecting another group has been given in step ST34 (NO in step ST34), whether or not the "back" button has been operated is determined (step ST36). Specifically, whether or not a "back" button 610 has been selected in group detail screen 700 in FIG. 28 is determined.

When it is determined in step ST36 that the "back" button has been operated MST in step ST36), the process ends (return). Namely, transition to preceding household electrical appliance monitor screen 500 is made.

When it is determined in step ST36 that the "back" button has not been operated (NO in step ST36), the process returns to step ST34.

Figure 33:
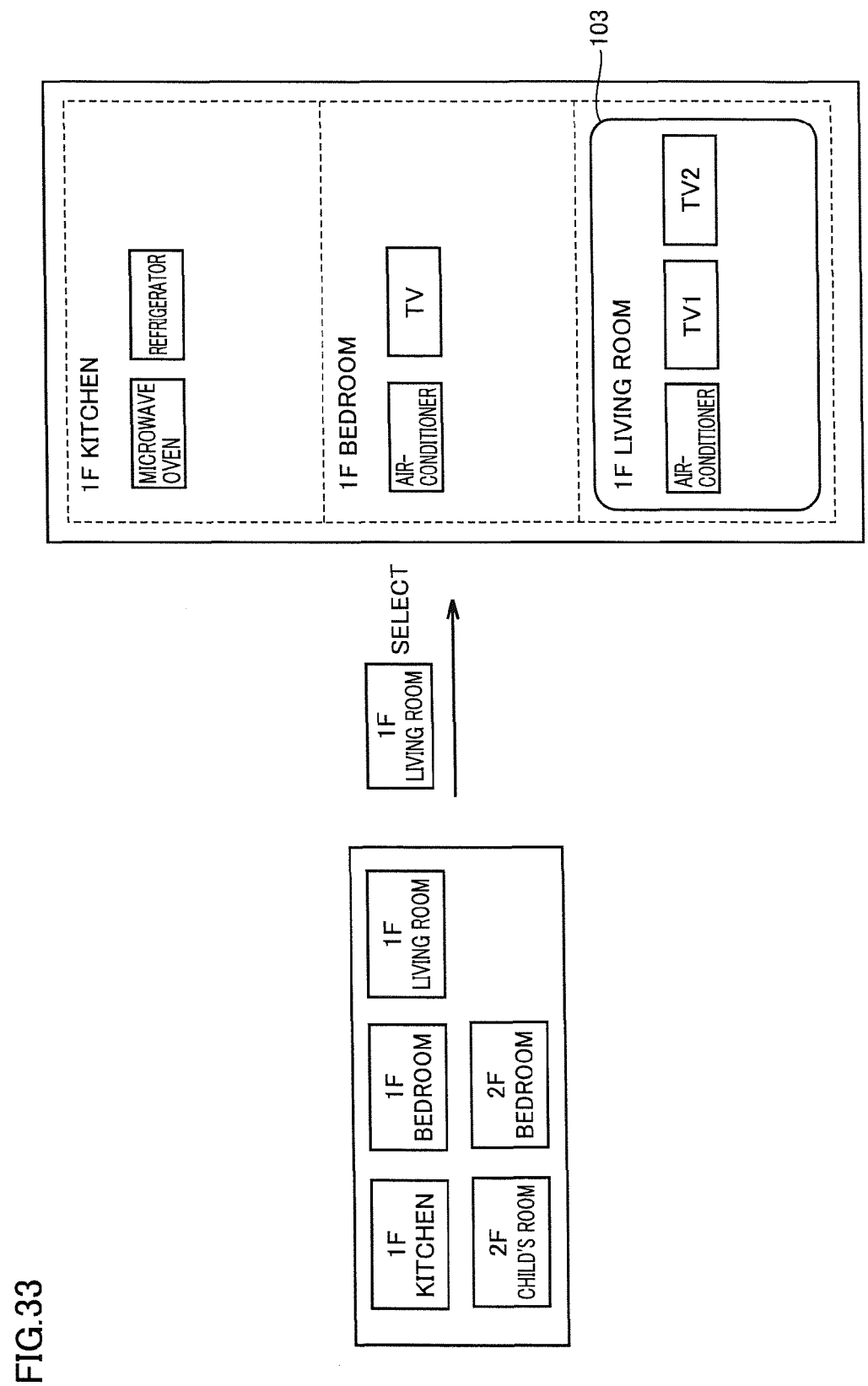
FIG. 33 is a diagram illustrating a concept of expansion processing in the processing for displaying the group detail screen according to the third embodiment of the present invention.

FIG. 33 is a diagram illustrating a concept of expansion processing in the processing for displaying the group detail screen according to the third embodiment of the present invention.

Referring to FIG. 33, by way of example, a power management object in the household electrical appliance monitor screen described with reference to FIG. 27 is shown in a schematic form. A case that one of power management objects, "1F living room," is selected is described.

When a power management object "1F living room" is selected, grouping based on floor is made as first grouping and hence expansion processing is performed for each group having attribute information "1F" categorized through that grouping. Expansion into a group of attribute information "1F living room," a group of attribute information"1F kitchen", and a group of attribute information "1F bedroom" is made.

Then, information on power consumption in an air-conditioner, a TV 1, and a TV 2 which are electrical appliances belonging to selected "1F living room" is displayed on display 103.

For example, when an operation instruction for selecting direction object 612 for selecting an upward direction is given as an instruction for selecting another group, information on power consumption in each of an air-conditioner and a TV which are electrical appliances belonging the group "1F bedroom" is displayed on display 103 in response to the instruction. When a further operation instruction for selecting direction object 612 selecting the upward direction is given, information on power consumption in each of a microwave oven and a refrigerator which are electrical appliances belonging the group "1F kitchen" is displayed on display 103.

By displaying a detail screen for each group in correspondence with an operation instruction for selection through such display, information on power consumption in an electrical appliance belonging to each group can readily be known.

Though a case that information on power consumption in an electrical appliance belonging to a group for which an operation instruction for selection has been given in display 103 is displayed on display 103 in correspondence with the operation instruction for selection is described in the present example, limitation thereto is not particularly intended. When there is a room in a display region of display 103, information on power consumption in an electrical appliance belonging to another group may together be displayed.

Though a case that a group detail screen of each group categorized through first grouping is displayed has been described in the present example, limitation thereto is not particularly intended and group detail screens of all groups may be expanded and displayed. For example, display in accordance with an operation instruction for selection may be provided also for a group of attribute information "2F".

<Other Variations>

For example, in a case that premises are collective housing such as condominiums or dormitories in the household electrical appliance monitor screen in FIG. 27, a "No." such as an apartment number may be registered instead of attribute information "floor", first grouping may be carried out for each apartment (No.), and then second grouping may be carried out for each piece of attribute information "room" for display. Information on power consumption for each household can be displayed and power saving can be encouraged.

Alternatively, regarding a type of an electrical appliance, electrical appliances of which information on power consumption is highly needed to be checked can be categorized in advance, first grouping of a plurality of electrical appliances can be carried out for each frequency of checking, and second grouping can be carried out for each piece of attribute information "room". For example, regarding a type of an electrical appliance, first grouping can be carried out, for example, with frequency of necessity for checking being set in three stages (high, medium, low) in correspondence. Since categorization is based on frequency of necessity for checking, a group of which power saving should be promoted by a user can readily be known, which is highly convenient.

Though second grouping based on attribute information "room" has been described above, limitation to that attribute information is not particularly intended and categorization may be based on other attribute information.

Figure 34:
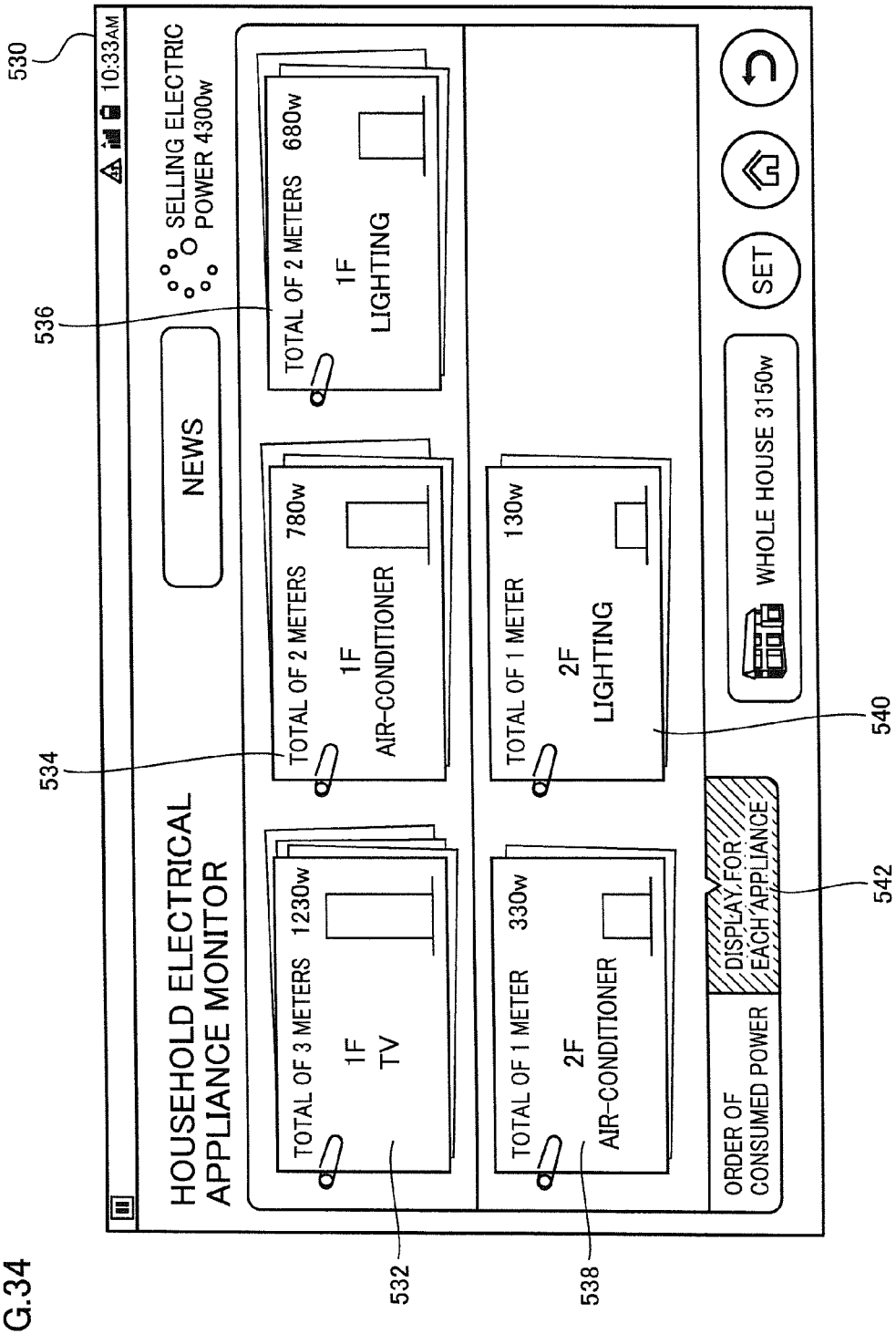
FIG. 34 is a diagram illustrating a variation of a household electrical appliance monitor screen according to the third embodiment of the present invention.

FIG. 34 is a diagram illustrating a variation of a household electrical appliance monitor screen according to the third embodiment of the present invention.

Referring to FIG. 34, here, a plurality of electrical appliances are grouped in a household electrical appliance monitor screen 530 based on received measurement information, and a screen in which object display of information on power consumption in a group of grouped electrical appliances is provided is shown.

Specifically, a plurality of power management objects are displayed, and five power management objects 532 to 540 are provided by way of example.

Here, in household electrical appliance monitor screen 530, first grouping is carried out based on attribute information "floor" and second grouping is carried out based on "type" of an electrical appliance as attribute information.

Namely, second grouping is carried out based on a type of electrical appliances "TV", "air-conditioner", and "lighting". Information on power consumption in types as a whole (consumed power) can readily be known based on categorization for each type of appliance and power saving can be encouraged.

A tab button 542 "display for each appliance" is provided in household electrical appliance monitor screen 530 and displayed in the present example. For example, however, by providing a tab button 512 "display for each room" as shown in FIG. 27, 275 household electrical appliance monitor screens 500 can also be displayed by selecting the tab button.

Though grouping based on "floor" in premises as attribute information in first grouping has been described in the present example, for example, categorization based on applications of electrical appliances may be made. For example, categorization into "AV equipment", "cooking", "air-conditioning", "house chores", and "cosmetic" as a type of electrical appliances may be made in advance, first grouping of a plurality of electrical appliances based on the applications may be carried out, and second grouping for each piece of attribute information "type" may be carried out for display. Alternatively, applications of electrical appliances employed as attribute information can also be registered in a user interface screen.

Alternatively, regarding a type of electrical appliances, whether or not electrical appliances are adapted to energy saving may be categorized in advance, first grouping of a plurality of electrical appliances may be made based on whether or not an electrical appliance is adapted to energy saving, and second grouping may be carried out for each piece of attribute information "type" for display. A group adapted to energy saving can readily be identified and power saving can be encouraged.

Regarding another scheme, frequency of use of a meter (consumed power measurement device) may be employed as attribute information for grouping. Specifically, the number of times of setting and registration of a meter (consumed power measurement device) or the number of times of change of a corresponding appliance may be stored, first grouping may be carried out based on whether or not the number of times is equal to or more than a prescribed number of times, and second grouping for each piece of attribute information "type" may be carried out for display. Categorization into appliances connected in a fixed manner and appliances otherwise can be made based on that grouping, and an appliance in which power should be saved can readily be identified and power saving can be encouraged.

Figure 35:
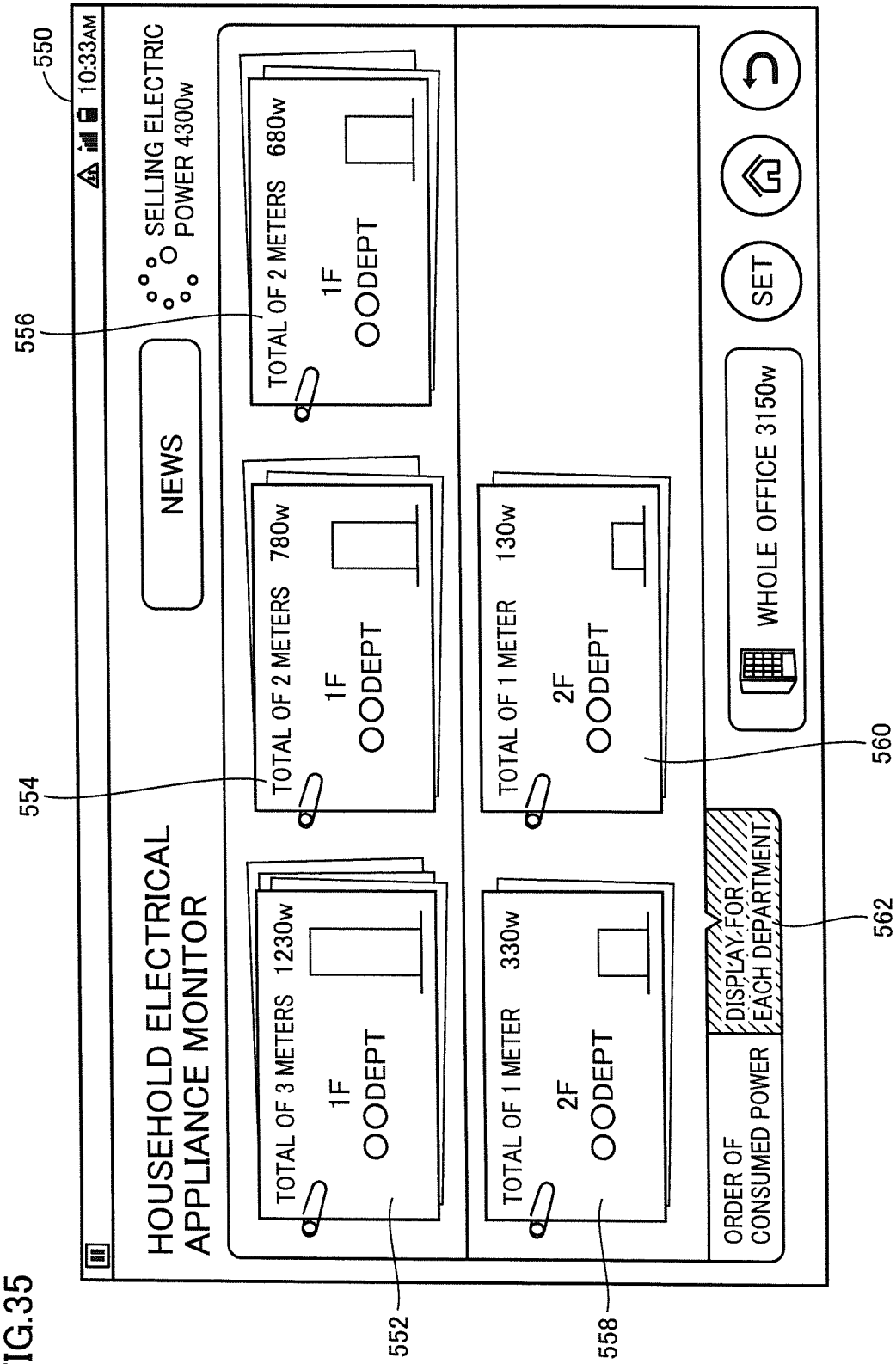
FIG. 35 is a diagram illustrating another variation of the household electrical appliance monitor screen according to the third embodiment of the present invention.

FIG. 35 is a diagram illustrating another variation of the household electrical appliance monitor screen according to the third embodiment of the present invention.

Referring to FIG. 35, here, a plurality of electrical appliances are grouped in a household electrical appliance monitor screen 550 based on received measurement information, and a screen in which object display of information on power consumption in a group of grouped electrical appliances is provided is shown.

Specifically, a plurality of power management objects are displayed, and by way of example, five power management objects 552 to 560 are provided.

Here, in household electrical appliance monitor screen 550, first grouping is carried out based on attribute information "floor" and second grouping based on "department" where an electrical appliance is used as attribute information is carried out.

Namely, based on categorization, for example, for each department such as "general affairs department", "accounting department", and "planning department" as "department" where an electrical appliance is used, power consumption in an electrical appliance can readily be known for each department and power saving can be encouraged. For example, information on departments to be used as attribute information can be registered in a user interface screen. Categorization may be based on a group name without limited to "department". Though first grouping based on attribute information "floor" has been described, grouping may be carried out based on area information such as "room" or "office".

Though two pieces of attribute information are set in the embodiment above, the present invention is not limited thereto and three or more pieces of attribute information may be set. For example, in a case of collective housing such as condominiums or dormitories, it is possible that there are 1F and 2F in each apartment. In that case, three attributes of "No." such as an apartment number, "floor" such as 1F or 2F, and "room" can be set as attribute information. Here, in household electrical appliance monitor screen 550, first grouping based on attribute information "No.", second grouping based on attribute information "floor", and third grouping based on attribute information "room" can be carried out and results thereof can be shown.

The present invention can set only one piece of attribute information. For example, in a case of a residential house, only "room" can also be set as attribute information. Here, in household electrical appliance monitor screen 550, first grouping based on attribute information "room" can be made and results there of can be shown.

<Specific Example of Power Management Object>

Though a form of cards as a form of power management objects has been described in the example above, limitation to such a form is not particularly intended and various forms can be made use of.

FIG. 36 is a diagram illustrating a variation of a form of a power management object according to the third embodiment of the present invention.

FIG. 36 (a) shows a form of a balloon and a balloon can be like cloud.

Alternatively, a power management object may be displayed in a form of another balloon as shown in FIG. 36 (b).

Alternatively, a three-dimensional power management object can also be displayed as shown in FIG. 36 (c) without limited to a two-dimensional object.

Such a form is by way of example, and a power management object having a form of an image such as a petal, a star, a hand, and a face can also be used.

Though display in a form of an object has been described above as display of information on power consumption, display in a form of a list can also be provided without using an object in particular.

<Other Configurations>

Though a configuration that display device 100 contains memory 110 recording information from meters 400A to 400E has been described, the present invention is not limited to that configuration and memory 110 can also be provided outside display device 100. By doing so, as compared with a case that memory 110 is provided in display device 100, a large capacity for storage can readily be achieved, which is preferred.

Memory 110 provided outside display device 100 can also operate in cooperation with another CPU having a function similar to that of CPU 101. As such, information from meter 400 can be processed by another CPU and recorded in memory 110, or measurement information recorded in memory 110 can be processed.

Processing here is, for example, accumulation of consumed power in each electrical appliance which is measurement information measured by meter 400 over a prescribed period of time for calculation of an amount of consumed power in the electrical appliance and record of that amount of consumed power in memory 110, or conversion in another CPU, of consumed power in each electrical appliance which is measurement information measured by meter 400 and recorded in memory 110 into display information for display on display 103 of display device 100.

As such, processing performed in display device 100 can be lessened and processing load on display device 100 can be mitigated.

[L: Other Embodiments]

Though a configuration example of local management system 2 associated with power system 1 has been shown as a typical configuration in the first to third embodiments and the variations thereof described above, a more highly networked configuration as represented by what is called a cloud system may be adopted.

For example, in realizing a management system according to the present embodiment as a cloud system, a function for storing measurement information, a function for generating electric power information, a function for holding and managing history information, and a function for holding and managing correspondence are performed by an external server device in their entirety or in part. In such a case, typically, as a function on a local side where power system 1 exists, a function for transferring measurement information from meter 400 to a server device on a remote side and a function for receiving data for displaying electric power information from the server device on the remote side and displaying the data on a display exist. In generating electric power information in the server device on the remote side, necessary electric power information can be accessed from any location and device through a Web browser.

Though embodiments of the present inventions have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

REFERENCE SIGNS LIST

1 power system; 2 management system; 100 display device; 100A home controller; 101, 301 CPU; 102 touch panel; 103 display; 104 tablet; 105 operation button; 106, 304 communication interface; 107 output interface; 108 input interface; 109, 302 hard disk; 110, 303 memory; 111 speaker; 112, 305 clock; 150, 150A history information table; 200 electrical appliance; 200A air-conditioner; 200B television; 200C microwave oven; 200D refrigerator; 200E lighting fixture; 200X photovoltaic power generation apparatus; 200Y rechargeable battery; 200Z power conditioner; 250A, 250B, 250C, 250D, 250E, 4002 plug; 300 data storage device; 350, 350B, 370, 370A measurement information table; 360 correspondence table; 400, 400A to 400E meter; 401 network; 402 power line; 4001 socket; 4003 shunt resistor; 4004, 4005 main line; 4007 power supply portion; 4010 electric power detection portion; 4011 voltage input ADC; 4012 current input ADC; 4013 multiplier; 4014 frequency conversion portion; 4020 communication module; 4021 CPU; 4022 ROM; 4023 RAM; 4024 GPIO; 4025 RF portion; 4030 antenna; 4041 LED; 4042 setting button; 4051, 4053 surface; and 4052 side surface.

The invention claimed is:

1. A management system for managing measurement information on power consumption in a plurality of electrical appliances which are associated with a plurality of meters, comprising:
a first storage module configured to chronologically store measurement information, transmitted from each of the plurality of meters;
a second storage module configured to store history information identifying over time, which one of the plurality of meters was associated with which one of the plurality of electronic appliances and including a time when the association was activated and
an information output module configured to create, in response to selection of one of the plurality of electrical appliances, electric power information for the selected electrical appliance by extracting, from the stored measurement information, measurement data from each meter associated with the selected electrical application during a specific time period and combining the extracted measurement data,
wherein the determination of which measurement information to extract is based on the measurement information in the first storage module and the history information in the second storage module.

2. The management system according to claim 1, further comprising:
a selection accepting module configured to provide a user interface screen for receiving designation of an associated electrical appliance for each of the plurality of meters,
wherein the second storage module is further configured to update contents in the history information based on designation of the associated electrical appliance accepted through the selection accepting module.

3. A management method of managing measurement information on power consumption in a plurality of electrical appliances which are associated with a plurality of meters, including:
chronologically storing, by the management system, measurement information transmitted from each of the plurality of meters,
chronologically storing, by the management system, history information identifying over time, which one of the plurality of meters was associated with which one of the plurality of electronic appliances and including a time when the association was activated; and
generating, by the management system, in response to selection of one of the plurality of electrical appliances, electric power information for the selected electrical appliance by extracting from the stored measurement information, the measurement data from each meter associated with the selected electrical application during a specific time period and combining the extracted measurement data,
wherein the determination of which measurement information to extract is based on the measurement information and the history information.

4. A management system for managing measurement information on power consumption in a plurality of electrical appliances which are associated with a plurality of meters, comprising:
an obtaining module configured to obtain measurement information transmitted from each of the plurality of meters; and
a storage module configured to chronologically store the measurement information obtained from each of the plurality of meters and to store history information identifying over time, which one of the plurality of meters was associated with which one of the plurality of electronic appliances and including a time when the association was activated
in response to selection of an electrical appliance, outputting electric power information on the selected electrical appliance,
wherein the power information of the selected electrical appliance is created by extracting from the stored measurement information, the measurement data from each meter associated with the selected electrical application during a specific time period and combining the extracted measurement data.

5. The management system according to claim 4, further comprising:

a selection accepting module configured to provide a user interface screen for receiving designation of an associated electrical appliance for each of the plurality of meters.

6. A management method of managing measurement information on power consumption in a plurality of electrical appliances which are associated with a plurality of meter, where each of the plurality of meters measures power consumption in one associated electrical appliance at a time, including:

obtaining, by the management system, measurement information transmitted from the plurality of meters, the measurement data from each meter corresponding to power consumption an associated one of the plurality of electrical appliances;

chronologically storing, by the management system, the measurement information obtained from the plurality of meters, based on correspondence between each of the plurality of meters and the associated one of the plurality of electrical appliances set in advance; and generating, by the management system, in response to selection of one of the plurality of electrical appliances, electric power information for the selected electrical appliance, wherein the power information of the selected electrical appliance is created by extracting from the stored measurement information, the measurement data from each meter associated with the selected electrical application during a specific time period and combining the extracted measurement data.

* * * * *